(12) United States Patent
Park et al.

(10) Patent No.: US 9,558,247 B2
(45) Date of Patent: *Jan. 31, 2017

(54) STORAGE DEVICE AND STREAM FILTERING METHOD THEREOF

(75) Inventors: Chanik Park, Seoul (KR); Jeonguk Kang, Bucheon-si (KR); Kangho Roh, Seoul (KR); Yang Seok Ki, San Jose, CA (US)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 313 days.

This patent is subject to a terminal disclaimer.

(21) Appl. No.: 13/599,052

(22) Filed: Aug. 30, 2012

(65) Prior Publication Data

US 2013/0060993 A1 Mar. 7, 2013

Related U.S. Application Data

(63) Continuation-in-part of application No. 13/187,867, filed on Jul. 21, 2011, now abandoned.

(30) Foreign Application Priority Data

Aug. 31, 2010 (KR) .................. 10-2010-0084969
Aug. 30, 2011 (KR) .................. 10-2011-0086933

(51) Int. Cl.
*G06F 17/30* (2006.01)
*G11C 7/10* (2006.01)
(Continued)

(52) U.S. Cl.
CPC ... *G06F 17/30554* (2013.01); *G06F 17/30516* (2013.01); *G06F 17/30867* (2013.01);
(Continued)

(58) Field of Classification Search
None
See application file for complete search history.

(56) References Cited

U.S. PATENT DOCUMENTS 7,889,651 B2 2/2011 Feng et al.
8,321,560 B1 11/2012 Pai et al.
(Continued)

FOREIGN PATENT DOCUMENTS

JP 2008-083808 4/2008
JP 2008-293578 12/2008
(Continued)

OTHER PUBLICATIONS

Teemu Pitkänen, et al, "Parallel Memory Architecture for Application-Specific Instruction-Set Processors", J Sign Process Syst (2009) 57, p. 21-32.
(Continued)

*Primary Examiner* — Rehana Perveen
*Assistant Examiner* — Raheem Hoffler
(74) *Attorney, Agent, or Firm* — Lee & Morse P.C.

(57) ABSTRACT

A storage device may include a main storage part including one or more memories; and a controller configured to control an overall operation of the main storage part. The controller includes a filter manager configured to store data format information and a filtering condition provided from a host; one or more stream filters configured to search and project data stored in the one or more memories in parallel in response to a control of the filter manager to produce searched and projected data; and a merge filter configured to merge the searched and projected data of the one or more stream filters in response to the control of the filter manager.

23 Claims, 19 Drawing Sheets

(51) Int. Cl.
  *G06Q 10/10* (2012.01)
  *G11C 16/26* (2006.01)
(52) U.S. Cl.
  CPC ............ *G11C 7/1006* (2013.01); *G06Q 10/10* (2013.01); *G11C 16/26* (2013.01)

(56) References Cited

U.S. PATENT DOCUMENTS

| | | | |
|---|---|---|---|
| 8,566,515 B2* | 10/2013 | Rubinstein et al. | 711/104 |
| 8,825,964 B1* | 9/2014 | Sopka et al. | 711/152 |
| 8,898,142 B2* | 11/2014 | Al-Omari | G06F 17/30463 707/713 |
| 2006/0212685 A1 | 9/2006 | Raghavan et al. | |
| 2008/0243979 A1 | 10/2008 | Cherkauer et al. | |
| 2008/0270403 A1 | 10/2008 | Bookman et al. | |
| 2008/0294802 A1 | 11/2008 | Kohinata et al. | |
| 2008/0320241 A1 | 12/2008 | Dees et al. | |
| 2009/0024572 A1* | 1/2009 | Mehta | G06F 17/30463 |
| 2009/0083212 A1* | 3/2009 | Bhattacharjee | G06F 17/30595 |
| 2009/0150873 A1 | 6/2009 | Taneda | |
| 2009/0182835 A1* | 7/2009 | Aviles | G06F 12/0813 709/213 |
| 2009/0281784 A1 | 11/2009 | Augusteijn et al. | |
| 2010/0082648 A1 | 4/2010 | Potapov et al. | |
| 2010/0185808 A1* | 7/2010 | Yu et al. | 711/103 |
| 2011/0040771 A1 | 2/2011 | Gilyadov et al. | |
| 2011/0131198 A1 | 6/2011 | Johnson et al. | |
| 2011/0307724 A1 | 12/2011 | Shaw et al. | |
| 2012/0066444 A1* | 3/2012 | Sadowski et al. | 711/105 |
| 2012/0079175 A1* | 3/2012 | Flynn et al. | 711/103 |
| 2012/0144104 A1* | 6/2012 | Gibney et al. | 711/105 |

FOREIGN PATENT DOCUMENTS

| | | |
|---|---|---|
| JP | 2010-522915 | 8/2010 |
| KR | 10-2005-0064281 A | 6/2005 |
| KR | 10-2008-0103402 A | 11/2008 |
| KR | 10-2009-0106476 A | 10/2009 |
| WO | WO-2008/116771 A1 | 10/2008 |

OTHER PUBLICATIONS

USPTO Rejection dated Nov. 8, 2012 for U.S. Appl. No. 13/187,867 (parent).
USPTO Final Rejection dated Jun. 7, 2013 for U.S. Appl. No. 13/187,867 (parent).
USPTO Rejection dated Feb. 24, 2014 for U.S. Appl. No. 14/021,081 (family member).
USPTO Final Rejection dated Sep. 12, 2014 for U.S. Appl. No. 14/021,081 (family member).
U.S. Appl. No. 14/947,926, filed Nov. 20, 2015, Raheem Hoffler.

* cited by examiner

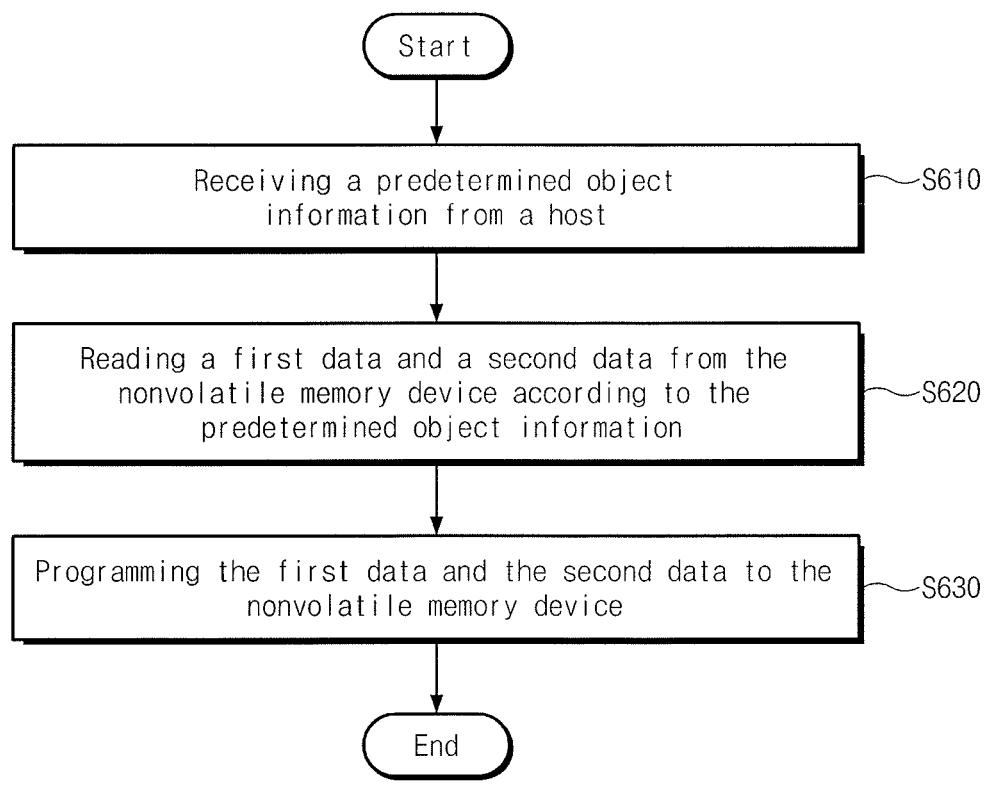

STORAGE DEVICE AND STREAM FILTERING METHOD THEREOF

CROSS-REFERENCE TO RELATED APPLICATIONS

This application claims the benefits, under 35 U.S.C. §119, of Korean Patent Application No. 10-2011-0086933, filed Aug. 30, 2011, the entirety of which is incorporated by reference herein. Also, this application is a continuation-in-part of U.S. patent application Ser. No. 13/187,867, filed Jul. 21, 2011, which in turn claims priority from Korean Patent Application No. 10-2010-0084969, filed Aug. 31, 2010, the entirety of which is incorporated by reference herein.

BACKGROUND

1. Field

Exemplary embodiments relate to a data storage device. More particularly, embodiments relate to a semiconductor memory-based storage device and a stream filtering method thereof.

2. Description of the Related Art

Semiconductor memory devices may be divided into volatile semiconductor memory devices and non-volatile semiconductor memory devices. Volatile semiconductor memory devices may perform read and write operations at a high speed, but lose stored contents at power-off. On the other hand, non-volatile semiconductor memory devices may retain stored contents even at power-off. Non-volatile semiconductor memory devices may be used as memory. The memory stores contents that will be maintained regardless of whether power is supplied.

Non-volatile semiconductor memory devices may include a mask read-only memory (MROM), a programmable read-only memory (PROM), an erasable programmable ROM (EPROM), an electrically erasable programmable ROM (EEPROM), etc.

Among non-volatile semiconductor memory devices, flash memory may be widely used as an audio and image data storing media of user devices, i.e., a computer, a cellular phone, PDA, a digital camera, a camcorder, a voice recorder, an MP3 player, a handheld PC, a game machine, a facsimile, a scanner, a printer, etc. Hereinafter, user devices will be called hosts.

Flash memory, for example, can be formed to have a removable card type, i.e., a multimedia card, a security digital card, a smart media card, a compact flash card, etc. Flash memory can be included as main storage device within an USB memory, a solid state drive (SSD), etc. Storage devices including flash memory may be inserted or detached in or from host according to a user request.

SUMMARY

Embodiments are directed to data storage devices.

One embodiment may be directed to a stream filtering method of a storage device which includes setting up a filter manager with data format information and a filtering condition provided from a host; searching and projecting data corresponding to the filtering condition from one or more memories in parallel by one or more stream filters according to a control of the filter manager to produce search and projected data; merging the searched and projected data at the one or more stream filters according to the control of the filter manager; and providing the merged result to the host.

The stream filtering method may further include performing a predetermined operation on the searched and projected data by the one or more stream filters according to the control of the filter manager.

The stream filtering method may further include merging results calculated by the one or more stream filters into one value by a merge filter according to the control of the filter manager.

The stream filtering method may further include configuring a virtual index on the searched and projected data by the one or more stream filters according to the control of the filter manager.

The stream filtering method may further include merging the virtual index configured by the one or more stream filters by a merge filter according to a control of the filter manager.

The data format information may support a Relational Database Management System (RDBMS) table format.

The filtering condition may include an operator, a field to be compared with data stored in the one or more memories, and field information to be provided as a filtering condition result.

The searching and projecting data corresponding to the filtering condition from one or more memories in parallel is performed to produce the searched and projected data independently with respect to the one or more memories each corresponding to the one or more stream filters.

Another embodiment may be directed to a storage device which includes a main storage part including one or more memories; a controller configured to control an overall operation of the main storage part, wherein the controller includes a filter manager configured to store data format information and a filtering condition provided from a host; one or more stream filters configured to search and project data stored in the one or more memories in parallel in response to a control of the filter manager to produce searched and projected data; and a merge filter configured to merge the searched and projected results of the one or more stream filters in response to the control of the filter manager.

Each of the one or more stream filters may include a selection unit selecting searched data corresponding to the filtering condition among the data stored in a corresponding memory according to the control of the filter manager; a projection unit projecting projected data corresponding to the filtering condition among the data stored in the corresponding memory according to the control of the filter manager; and an aggregation unit combining or calculating searched data and projected data from the selection unit and the projection unit into a merged result according to the control of the filter manager.

The merge filter may re-calculate results from the one or more stream filters so as to be merged into one value, under the control of the filter manager.

Each of the one or more stream filters may configure a virtual index on the searched and projected data of each of the one or more stream filters under the control of the filter manager.

The merge filter may merge the virtual index configured by the one or more stream filters under the control of the filter manager.

The merge filter may merge the virtual index configured by the one or more stream filters under the control of the filter manager.

The filter manager, the one or more stream filters, and the merge filter may be formed by hardware within the controller.

The data format information and the filtering condition may be freely set up by the host.

Still another embodiment may be directed to a stream filtering method of a storage device, which includes setting up a filter manager with data format information and a filtering condition provided from a host; searching and projecting data corresponding to the filtering condition from one or more memories in parallel by one or more stream filters according to a control of the filter manager to produce searched and projected data; updating the searched and projected data at the one or more stream filters according to the control of the filter manager to produce updated searched and projected data; and storing the updated searched and projected data in a memory corresponding to the updated searched and projected data among the one or more memories according to the control of the filter manager.

The searched and projected data may be updated without a transfer to the host.

Yet another embodiment may be directed to a storage device which includes a flash memory, a buffer for temporarily storing buffer data generated during an operation, and a memory controller for controlling the flash memory and the buffer, wherein the memory controller includes a filter manager configured to store data format information and a filtering condition provided from a host, a flash interface which includes one or more stream filters configured to search and project data stored in one or more memory controller memories in parallel in response to a control of the filter manager to produce searched and projected data, at least one microprocessor, and a host interface which includes a merge filter configured to merge the searched and projected data of the one or more stream filters in response to the control of the filter manager.

Yet another embodiment may be directed to a storage device which includes a first channel connected to at least one first non-volatile memory device, and a first memory controller including a first processor connected to the first channel, the first processor configured to receive a data processing code information from a host, to load the data processing code information, and to perform data processing using the at least one first non-volatile memory device according to the data processing code information.

Performing data processing may include, in part, performing data processing using a non volatile memory device.

The storage device may include a second channel connected to at least one second non volatile memory device and a second memory controller including a second processor connected to the second channel, the second processor configured to receive a data processing code information from the host, to load the data processing code information and to perform the data processing using the least one second non-volatile device according to the data processing code information.

The first processor may be a stream processor. The stream processor may include Application Specific Instruction-Set Processor (ASIP), Application Specific integrated Circuits (ASIC), or field-programmable gate array (FPGA).

The storage device may include a host interface connecting the host and the data storage device, the host interface providing the data processing code information with the first memory controller.

The storage device may include a microprocessor configured to control the first memory controller, to reprocess the data provided from the first memory controller, and to provide the reprocessed data to the host. The microprocessor may be connected to the first memory controller through an interconnection network. The interconnection network may include at least one of a bus or a cross bar switch.

The first memory controller further may include a random access memory device configured to temporarily store data from the first memory controller.

The first processor may include a plurality of arithmetic logic units, a configuring memory device to store the data processing code information from the host, and a main controller configured to control the configuring memory, to alter the data processing code and the data process, and to control the data process operation of the arithmetic logic units. The arithmetic logic unit may be configured to perform data processing of the non-volatile memory device according to the data processing code stored in the configuring memory device.

The first processor may include a multiplexer configured to receive a selection signal for selecting data according to the selection signal, the multiplexer being controlled by the main controller.

The first processor may include an instruction multiplexer configured to receive a selection signal under the control of the main controller, select one of a plurality of instruction signals from the configuring memory device and provide an enable signal corresponding to the selected instruction to the arithmetic and logic unit.

The first processor may include a data demultiplexer configured to receive a selection signal under the control of the main controller and processed data by the arithmetic and logic unit, and provide multiple data to the host.

Yet another embodiment may be directed to a method of operating a storage device, the method including receiving a compaction command and a range of data corresponding to the compaction command from a host, reading a data corresponding to the range from non-volatile memory, merging the read data corresponding to the range according to the compaction command, and storing the merged data to the non-volatile memory.

Erasing the read data in the non-volatile memory device may occur when merging the read data is performed.

Yet another embodiment may be directed to a method of operating a computing system, the method including receiving a first command, measuring each cost of a plurality of operations corresponding to the first command, comparing the cost of the plurality of operations and selecting an optimal operation among the plurality of operations, and providing a storage device with a second command when the selected operation is corresponding to the storage device.

Measuring each cost of operations may include referring to an operation time in a database table corresponding to the first command.

The method may include receiving a result of the second command operation from the storage device.

The optimal operation may be an operation with the least cost.

The storage device may include a plurality of non-volatile memory devices and a stream processor which enables the storage device to perform the second command independently.

Yet another embodiment may be directed to a method of operating a computing system, the method including receiving a plurality of tasks, measuring an operation cost of each task, selecting a device to perform each task on the basis of the measured cost, and providing a storage device with a first command, the storage device including a non-volatile memory device when the storage device is selected based on the cost.

Selecting a device to perform the task may include searching the least cost-consuming device for the task.

The storage device may include a plurality of non-volatile memory devices and a stream processor which enables the storage device to perform the task independently.

Yet another embodiment may be directed to a method of operating an intelligent solid state driver including a non-volatile memory device, the method including receiving a predetermined object information from a host, reading a first data and a second data from the non-volatile memory device according to the predetermined object information, and programming the first data and the second data to the non-volatile memory device.

The first data and the second data may be stored in separate pages in the non-volatile memory device.

Programming may include storing the first data and the second data in an area different from a read area.

BRIEF DESCRIPTION OF THE DRAWINGS

Features will become apparent to those of ordinary skill in the art by describing in detail exemplary embodiments with reference to the attached drawings in which:

FIG. 20 illustrates a flow chart showing operating an intelligent solid state driver including a non-volatile memory device according to an exemplary embodiment.

DETAILED DESCRIPTION

Example embodiments will now be described more fully hereinafter with reference to the accompanying drawings; however, they may be embodied in different forms and should not be construed as limited to the embodiments set forth herein.

The terminology used herein is for the purpose of describing particular embodiments only and is not intended to be limiting of present embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on" another element or layer, it can be directly on the other element or layer, or intervening elements or layers may be present. In contrast, when an element is referred to as being "directly on" another element or layer, there are no intervening elements or layers present.

A solid state drive (SSD) adopting a flash memory among semiconductor memories as a main storage device will be described as a storage device. However, a storage device and a data storing method thereof may be applied to a different-type storage device (e.g., a memory card, etc.) as well as the SSD.

Figure 1:
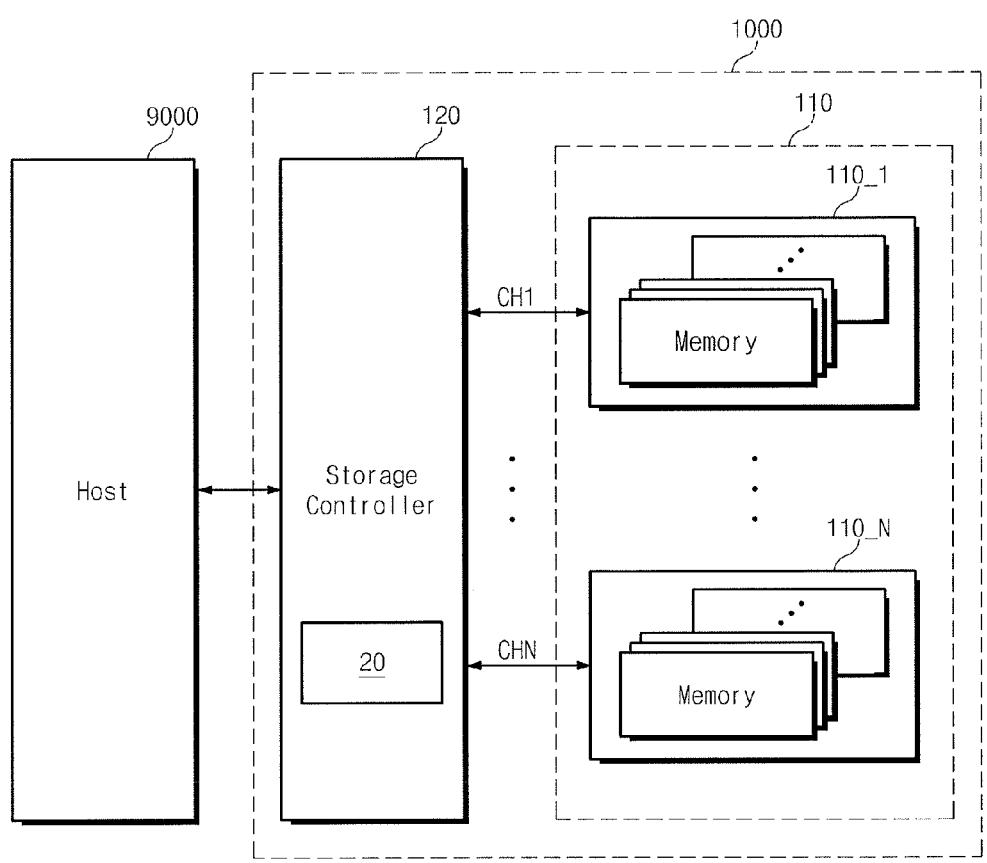
FIG. 1 illustrates a diagram showing a storage device according to an exemplary embodiment and a user device including the same.

FIG. 1 is a diagram showing a storage device according to an exemplary embodiment and a user device including the same.

Referring to FIG. 1, a user device may include a host 9000 and a storage device 1000. The host 9000 may be configured to control the storage device 1000. The host 9000 may include a user device such as a personal/portable computer, a personal digital assistant (PDA), an MP3 player, etc. The host 9000 and the storage device 1000 may be interconnected by a standardized interface such as an USB, SCSI, ESDI, SATA, SAS, PCI-express, or IDE interface. An interface manner for connecting the host 9000 and the storage device 1000 is not limited to this disclosure, and could be configured in a different manner.

The storage device 1000 may be formed of a solid state drive (or, a solid state disk). Hereinafter, the solid state drive will be referred to as a SSD. The storage device 1000 is formed of a SSD. But, the storage device 1000 is not limited to this disclosure, and could be formed differently. For example, the storage device 1000 may be integrated in one semiconductor device to form a personal computer memory card international association (PCMCIA), a compact flash (CF), a smart media card (SM, SMC), a memory stick, a multimedia card (MMC, RS-MMC, MMC-micro), an SD card (SD, miniSD, microSD, SDHC), an universal flash storage (UFS) device, etc.

The storage device 1000 may include a storage controller 120 and a main storage part 110. A plurality of channels CH1 to CHN may be formed between the storage controller 120 and the main storage part 110.

The main storage part 110 may be formed of a plurality of non-volatile memory chips, i.e., a plurality of flash memories 110_1 to 110_N. Each of the channels CH1 to CHN may be connected in common with a plurality of flash memories. As another example, the main storage part 110 may be formed of different-type non-volatile memory chips (e.g., PRAM, FRAM, MRAM, etc.) instead of flash memory chips. Alternatively, the main storage part 110 can be formed of volatile memories, i.e., DRAM or SRAM, and may have a hybrid type where two or more types of memories are mixed.

The storage controller 120 may control a read/write/erase operation of the main storage part 110 in response to a request from the host 9000. A parallel stream filter 20 may be provided within the storage controller 120 such that a predetermined data processing function is carried out by the storage device 1000 instead of the host 9000. The parallel stream filter 20 may be configured in hardware within the storage controller 120. A data processing operation executed by the parallel stream filter 20 is called a stream filtering operation.

The parallel stream filter 20 may make data processing in parallel via a plurality of stream filters within the storage device. Data processing results of the plurality of stream filters may be merged effectively by a merger filter. A parallel data processing operation of the parallel stream filter 20 may be applied to an operation of writing data in the main storage part 110 as well as an operation of reading data from the main storage part 110. With a configuration of the parallel stream filter 20, a data processing function may be executed effectively within the storage device 1000 instead of the host 9000. This enables the burden of the host 9000 associated with data processing to be reduced.

Figure 2:
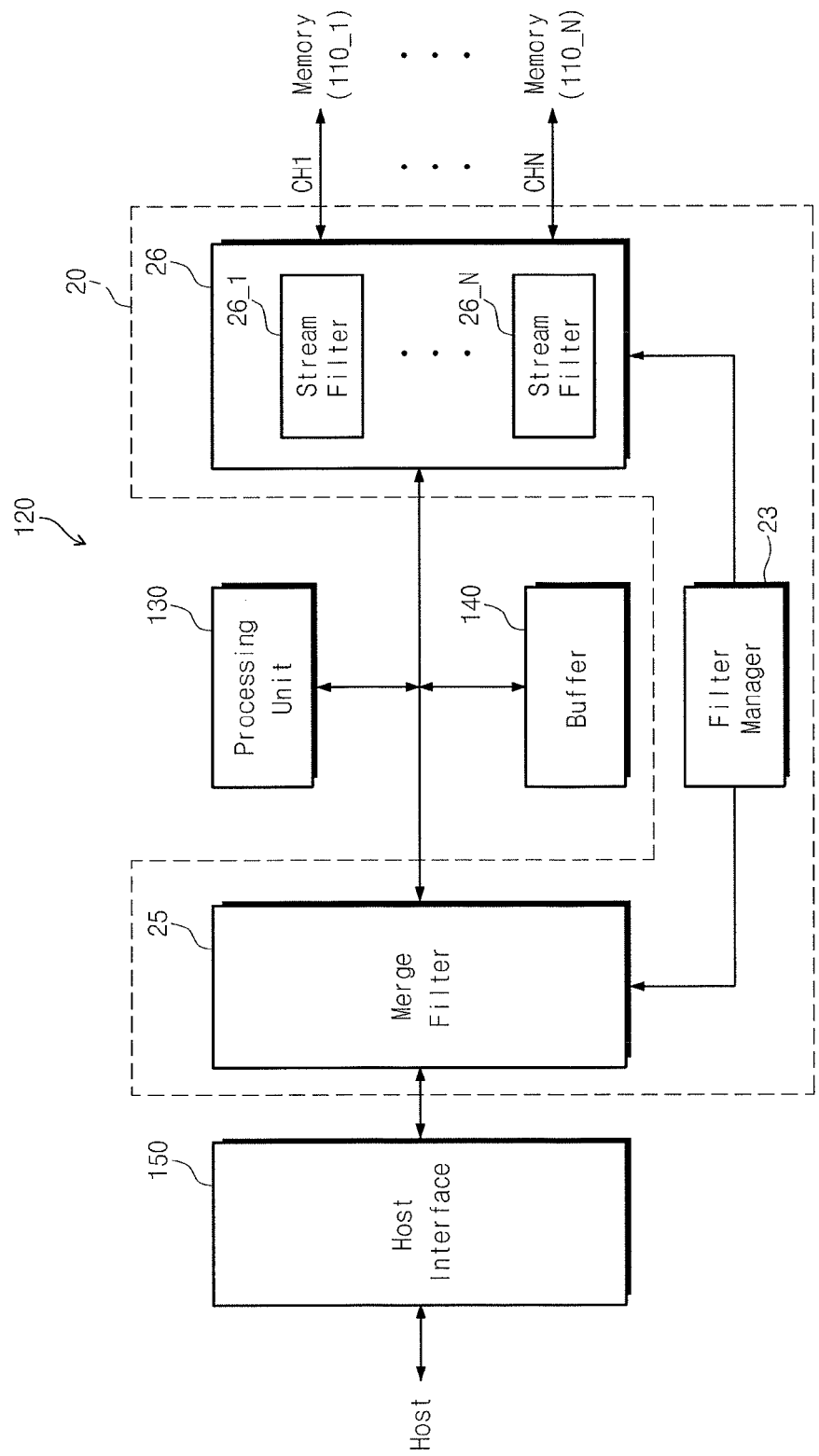
FIG. 2 illustrates a diagram showing a storage controller illustrated in FIG. 1.

FIG. 2 is a diagram showing a storage controller illustrated in FIG. 1.

Referring to FIG. 2, a storage controller 120 may be an SSD controller if a storage device 1000 is an SSD. The storage controller 120 may include a host interface 150, at least one processing unit 130, a buffer 140, and a parallel stream filter 20. The storage controller 120 illustrated in FIG. 2 is related to an exemplary embodiment and may be changed and modified. For example, although not shown in FIG. 2, the storage controller 120 may further include a flash interface circuit, an ECC circuit for detecting and correcting errors of data read out from a main storage part 110, etc.

The host interface 150 may be configured to interface with the host 9000. The processing unit 130 may be configured to control an overall operation of the storage controller 120. In an exemplary embodiment, the processing unit 130 may be a commercial or custom-made microprocessor.

The buffer 140 may be one or more general purpose memory devices which include software for operating the storage device 120 and data. The buffer 140 may include a cache, ROM, PROM, EPROM, EEPROM, PRAM, flash memory, SRAM, and DRAM. Further, the buffer 140 may be used to temporarily store data to be stored in or read out from the main storage part 110 and to temporarily store data processed by the parallel stream filter 20.

The parallel stream filter 20 may include a filter manager 23, a merge filter 25, and one or more stream filters 26. The filter manager 23 may control the merger filter 25 and the stream filter 26 based on a data format and a data process request, executed according to the data format, from the host 9000.

In an exemplary embodiment, the stream filter 26 may be provided to correspond to each of a plurality of channels CH1 to CHN formed between the storage controller 120 and the main storage part 110. For example, if N channels are formed between the storage controller 120 and the main storage part 110, N stream filters 26_1 to 26_N may be provided. In this case, the N stream filters 26_1 to 26_N may be implemented to have the same configuration one another.

The N stream filters 26_1 to 26_N may perform a filtering operation independently with respect to the respective channels CHI to CHN, and filtering operations of the N stream filters 26_1 to 26_N may be executed in parallel according to the control of the filter manager 23. In an exemplary embodiment, the N stream filters 26_1 to 26_N may be formed within a flash interface circuit which makes interface with a plurality of flash memories 110_1 to 110_N via the N channels CH1 to CHN. However, the location and configuration of the stream filter 26 may be modified and changed, and is not limited to this disclosure. N filtering results obtained by the parallel processing of the N stream filters 26_1 to 26_N may be stored in the buffer 140.

The merge filter 25 may execute a function of merging filtering results of the N stream filters 26_1 to 26_N temporarily stored in the buffer 140. A merge operation of the merger filter 25 may be executed under the control of the filter manager 23. In an exemplary embodiment, the merge filter 25 may be implemented within the host interface circuit 150 which makes interface with the host 9000. However, the location and configuration of the merge filter 25 may be modified and changed, and is not limited to this disclosure.

Figure 3:
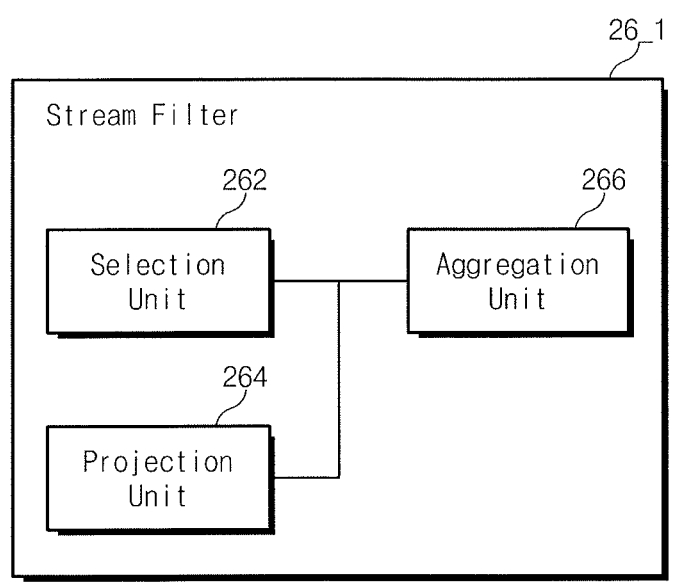
FIG. 3 illustrates a diagram showing a stream filter illustrated in FIG. 2.

FIG. 3 is a diagram showing a stream filter illustrated in FIG. 2. In FIG. 3, there is illustrated one stream filter 26_1 of a plurality of, for example, N stream filters 26_1 to 26_N in FIG. 2. The N stream filters 26_1 to 26_N may be formed to have the same configuration.

Referring to FIG. 3, the stream filter 26_1 may include a selection unit 262, a projection unit 264, and an aggregation unit 266. The selection unit 262 may select data corresponding to a predetermined condition among data stored in flash memories 110_1 according to the control of the filter manager 23. The projection part 264 may extract data corresponding to a predetermined condition among data stored in flash memories 110_1 according to the control of the filter manager 23.

Under the control of the filter manager 23, the aggregation unit 266 may combine or calculate the selected and/or extracted results of the selection unit 262 and the projection unit 264 may convert a required field of a plurality of records into one value.

As illustrated in FIG. 2, in the event that a parallel stream filter 20 may include N stream filters 26_1 to 26_N each corresponding to N channels CH1 to CHN, N outputs may be generated in parallel from the N stream filters 26_1 to 26_N. N outputs generated in parallel from aggregation units 266 in the N stream filters 26_1 to 26_N may be stored in a buffer 140 temporarily. The N outputs temporarily stored in the buffer 140 may be merged by the merge filter 25 according to the control of the filter manager 23.

The parallel stream filter 20 may execute a stream filtering operation in which a data processing operation of a host 9000 is partially executed directly within a storage device 1000 instead of the host 9000. With the stream filtering operation, it is possible to skip an operation of transferring data in the main storage part 110 of the storage device 1000 into the host 9000, a data processing operation of the host 9000, and an operation of storing a processed result provided from the host 9000 in the main storage part 110 by the storage device 1000. A data processing operation executed by the parallel stream filter 20 may be made at an operation of reading data from the main storage part 110 or at an operation of writing data therein.

Figure 4:
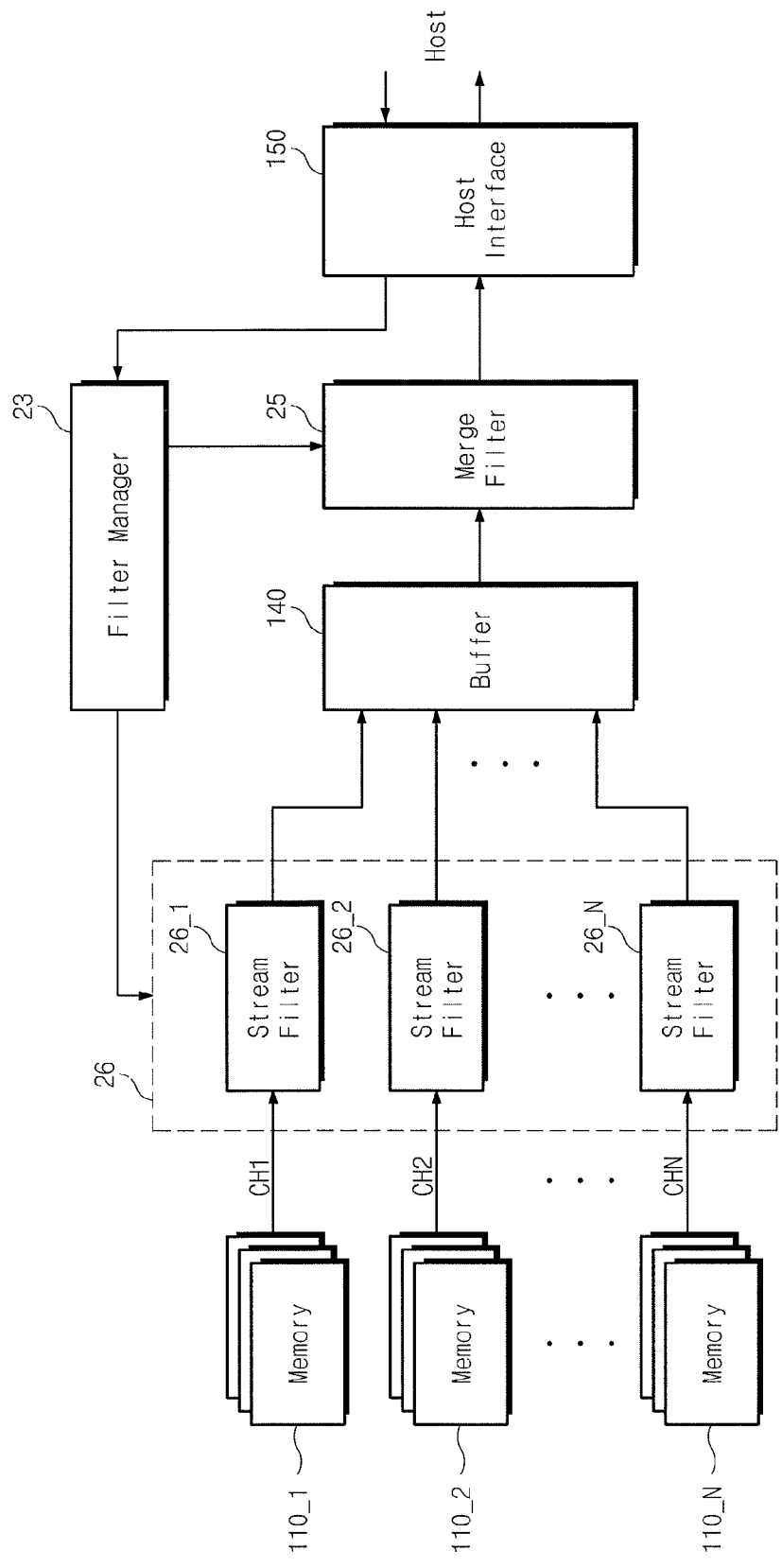
FIG. 4 illustrates a diagram for showing an operation of a parallel stream filter according to an exemplary embodiment when data stored in a main storage part is read out.

FIG. 4 is a diagram for describing an operation of a parallel stream filter according to an exemplary embodiment when data stored in a main storage part is read out.

Referring to FIG. 4, a filter manager 23 of the parallel stream filter 20 may be set with two types of information to perform a data processing operation requested from the host 9000. The setting of the filter manager 23 may be made under the control of the host 9000.

The first type of information of the filter manager 23 may include a format of data stored in a storage device. For example, in case of RDBMS (Relational Database Management System), the first type of information means information on a format of a table where data is stored. Such information may represent the number of table columns or fields per row. A size of each column or field may be defined by such information.

Figures 5, 6:
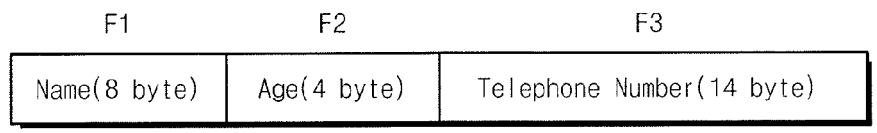
FIG. 5 illustrates a diagram showing a data format of a filter manager being set by a host.
FIG. 6 illustrates a diagram for showing a parallel stream filtering operation according to a filtering condition of a filter manager being set by a host.

FIG. 5 is a diagram showing a data format of a filter manager being set by a host.

In FIG. 5, there is illustrated an example that three fields F1 to F3 are set within the filter manager 23 by a host. For example, 8-byte may be assigned to the first field F1 as a record or tuple representing "Name". 4-byte may be assigned to the second field F2 as a record or tuple representing "Age", and 14-byte may be assigned to the third field F3 as a record or tuple representing "Telephone Number". At this time, a field format and a field length may be set variously by the host 9000. If the filter manager 23 is set with a format of a table storing data like a format illustrated in FIG. 5, data of the main storage part 110 may be searched or stored according to the set table format.

The second type of information of the filter manager 23 may represent a condition needed to execute a filtering operation. The filtering information may include a field being an object to be compared among data stored in the main storage part 110 and field information to be provided as a result. Herein, it is possible to freely set up the data format information and filtering condition by the host 9000.

For example, as illustrated in FIG. 5, to search a telephone number of a person named "AA" within a table storing a name, an age, and a telephone number as a record or tuple, the host 9000 may set up the filter manager 23 with a record format of a table being <8 Bytes, 4 Bytes, 14 Bytes>. And then, the host 9000 may set up the filter manager 23 with a filtering condition of <F1="AA", F3>. This condition represents a message such as send an output of the third field F3 when a value of the first field F1 has "AA".

After set up with the filtering condition of <F1="AA", F3>, the filter manager 23 may search a telephone number corresponding to a name "AA" from N memories 110_1 to 110_N each corresponding to N channels CH1 to CHN via N stream filters 26_1 to 26_N.

FIG. 6 is a diagram for describing a parallel stream filtering operation according to a filtering condition of a filter manager being set by a host.

Referring to FIGS. 4 and 6, under the control of a filter manager 23, N stream filters 26_1 to 26_N perform a stream filtering operation in parallel to search a telephone number corresponding to a name being "AA" (refer to 10, in FIG. 6). Searched results of the N stream filters 26_1 to 26_N may be stored in the buffer 140 temporarily. The merge filter 25 may merge outputs of the N stream filters 26_1 to 26_N temporarily stored in the buffer 140 under the control of the filter manager 23. A merge result of the merge filter 25 may be provided to a host 9000 via the host interface 150.

With the stream filtering operation, it is possible to search data satisfying a predetermined condition directly from N memories 110_1 to 110_N, in which data to be searched is stored, in parallel via N stream filters 26_1 to 26_N. Results searched in parallel by the N stream filters 26_1 to 26_N may be merged by the merge filter 25 such that only a desired result is finally provided to the host 9000. A parallel stream filter 20 may search data within the storage device 1000 storing data to be searched and provide the searched data to the host 9000 as desired data. Thus, it is possible to reduce a burden of the host 9000 by performing a data search operation by the storage device 1000 instead of the host 9000. Further, it is possible to reduce an unnecessary data transfer between the storage device 1000 and the host 9000. In particular, since a plurality of stream filters 26_1 to 26_N in the parallel stream filter 20 performs stream filtering operations in parallel, a filtering speed may be improved and power consumption may be minimized.

The N stream filters 26_1 to 26_N may further provide an aggregation function together with the above-described selection function and projection function for extracting a desired field from a corresponding record. The aggregation function may be executed by an aggregation unit 266 in each of the stream filters 26_1 to 26_N. For example, each stream filter may search a field satisfying a predetermined condition, and the aggregation unit 266 may calculate the searched fields to be converted into one value. With the aggregation function, it is possible to provide the number of specific records, a total of desired fields, an average of desired fields, etc.

For example, it is assumed that the host 9000 may need an average age of persons over age 30. This will be more fully described with reference to a data format illustrated in FIG. 5. First of all, the host 9000 may notify a filter manager 23 that a record format is <8 Bytes, 4 Bytes, 14 Bytes>. Then, the host 9000 may set up the filter manager 23 with a filtering condition of <F2 >=30, F2, AVERAGE>. The filtering condition may represent "Obtain an average of the second field F2 when a value of the second field F2 is identical to or more than 30".

At this time, each of the stream filters 26_1 to 26_N may provide an average value on data stored in a corresponding memory 111_i (i being 1 to N). Accordingly, the N stream filters 26_1 to 26_N may output average values on the N memories 110_1 to 110_N in parallel. The N average values provided in parallel from the N stream filters 26_1 to 26_N may be temporarily stored in a buffer 140.

The merge filter 25 may merge the N average values temporarily stored in the buffer 140 under the control of the filter manager 23 to generate a final average value. The final average value generated by the merge filter 25 may be provided to the host 9000 by the host interface 150. In this case, basic and statistics operations for obtaining the final average value may be provided to the merge filter 25.

The merge filter 25 may further provide a virtual index configuring function together with such a function that a final result is generated by merging N stream filtering results provided from the N stream filters 26_1 to 26_N.

The virtual index may mean a function of temporarily configuring an index for rapidly searching specific data later. The merge filter 25 may merge index information configured with respect to data stored in respective memories 110_1 to 110_N each corresponding to the stream filters 26_1 to 26_N and notify the host 9000 of final index information on data overall stored in the storage device 1000.

For example, it is assumed that the host 9000 needs a telephone number from persons below age 30. This may be accomplished as follows. First of all, an index may be made with respect to data stored in memories 110_1 to 110_N each corresponding to the stream filters 26_1 to 26_N. In this case, ages of persons below age 30 may be used as a key of the index (refer to 30 in FIG. 6). For this, the host 9000 may set up the filter manager 23 with information of <F2 <=30, F3, VIRTUAL INDEX, F2>. The information may represent "Provide the third field F3 when a value of the second field F2 is identical to or less than 30" and Configure a virtual index using the second field F2 as a key. Each of the stream filters 26_1 to 26_N may configure a virtual index using the second field F2 as a key according to the control of the filter manager 23. Virtual indexes configured by the stream filters 26_1 to 26_N may be merged by the merge filter 25, so that final index information on data overall stored in the storage device 1000 is configured. The final index information configured by the merge filter 25 may be provided to the host 9000 by the host interface 150.

A stream filtering operation of the parallel stream filter 20 is exemplarily described under the assumption that data stored in the main storage part 110 is read out and provided to the host 9000. However, the stream filtering operation of the parallel stream filter 20 may be applied to an operation of writing data in the storage device 1000 to process data en bloc.

Figure 7:
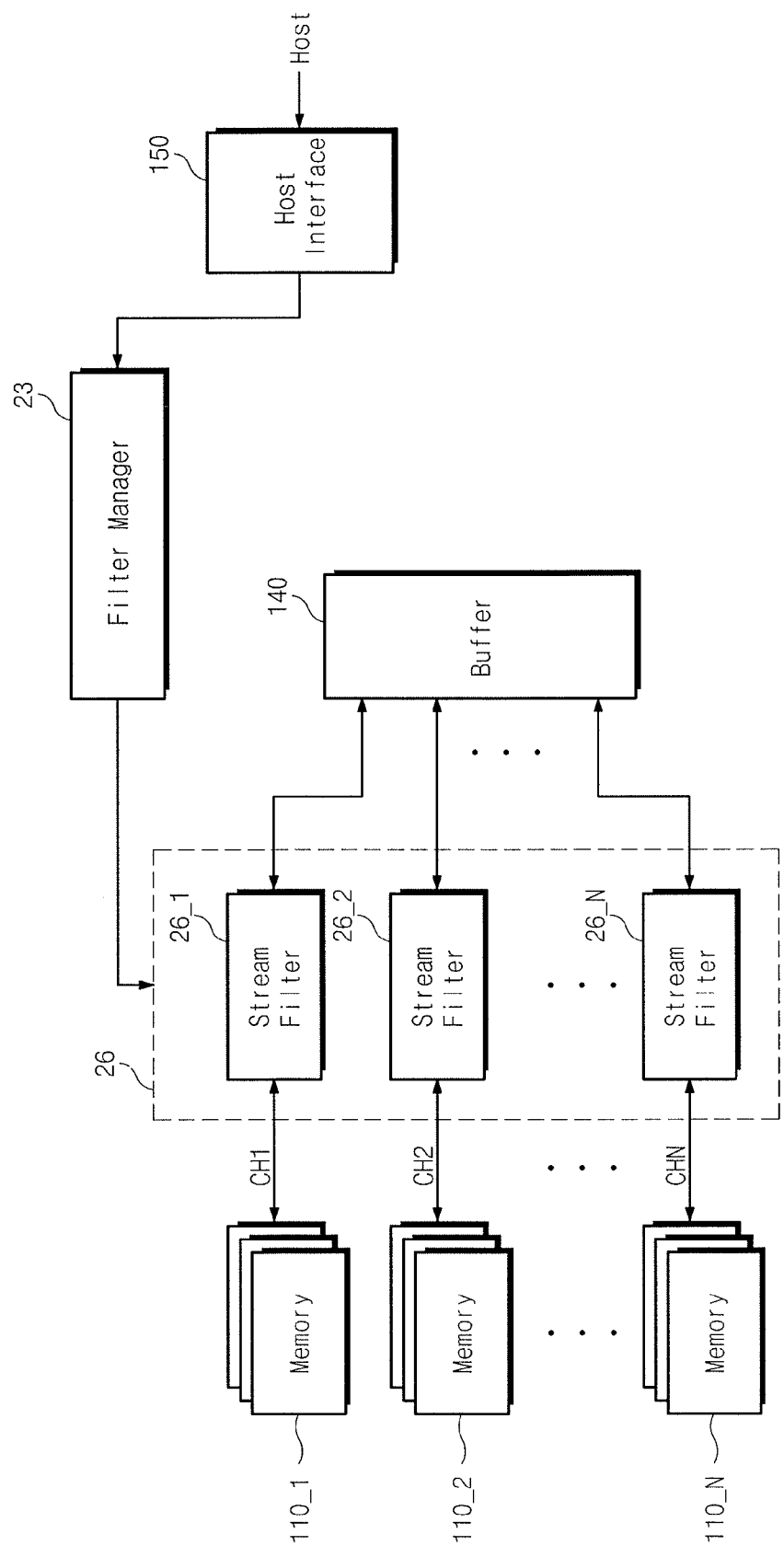
FIG. 7 illustrates a diagram for showing an operation of a parallel stream filter according to an exemplary embodiment when data is written in a main storage part.

FIG. 7 is a diagram for describing an operation of a parallel stream filter according to an exemplary embodiment when data is written in a main storage part.

Referring to FIG. 7, the parallel stream filter 20 may perform a stream filtering operation in which data stored in the main storage part 110 is directly processed by the parallel stream filter 20 and the processed result is directly stored in the main storage part 110 without the intervention of the host 9000. The host 9000 may set up the filter manager 23 with a stream filtering operation to be executed.

For example, referring to FIGS. 5 and 6, it is assumed that the host 9000 wants to change a telephone number of a person named "AA". In this case, the host 9000 may set up the filter manager 23 with information of <F1=="AA", "UPDATE">. This may represent "Update a value of the third field F3 when a value of the first field F1 is "AA".

Referring to FIGS. 6 and 7, N stream filters 26_1 to 26_N may perform a stream filtering operation in parallel under the control of the filter manager 23, respectively. That is, the N stream filters 26_1 to 26_N may search a telephone number of a person named "AA" to update the searched telephone number with a new value. In this case, values searched and updated by the N stream filters 26_1 to 26_N may be stored in the buffer 140 temporarily. The result updated by a stream filter 26_i (i being 1 to N) may be stored in a corresponding memory 110_i.

With the above-described parallel stream filtering operation, search and update operations on a desired field may be carried out directly within the storage device 1000 without the intervention of the host 9000. Accordingly, it is possible to reduce the burden of the host 9000 and an unnecessary data transfer between the storage device 1000 and the host 9000, by processing a data search operation of the host 9000 within the storage device 1000.

Figure 8:
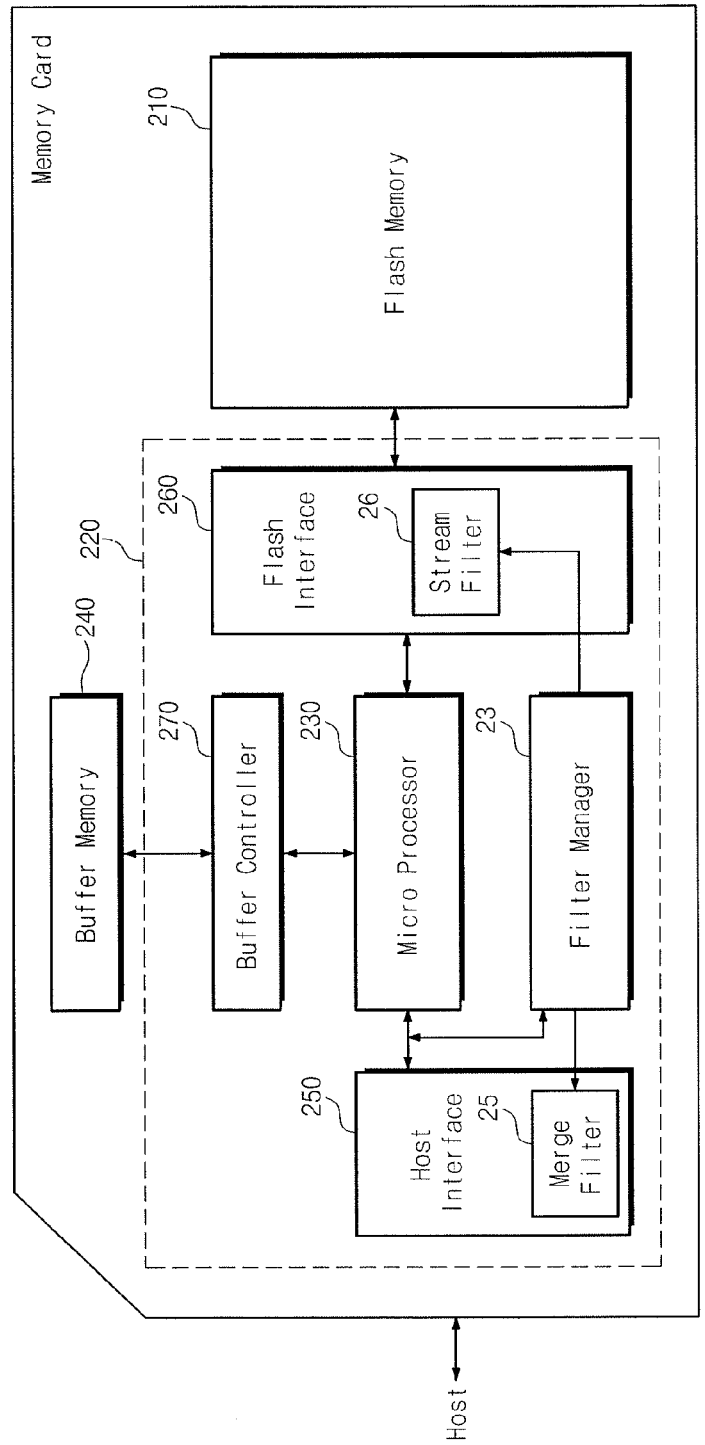
FIG. 8 illustrates a diagram showing a storage device according to an exemplary embodiment.

An operation of the parallel stream filter 20 is exemplarily described using the RDBMS table as an example. However, it is well understood that the parallel stream filter 20 is applied to all field-based data structures FIG. 8 is a diagram showing a storage device according to an exemplary embodiment. In FIG. 8, there is exemplarily illustrated a storage device 2000 in FIG. 8 that forms a flash memory card.

Referring to FIG. 8, the storage device 2000 may include a flash memory 210, a buffer 240, and a memory controller 220 for controlling the flash memory 210 and the buffer 240. The buffer 240 may be a device which temporarily stores data generated during an operation of the storage device 2000. The buffer 240 may be implemented by DRAM or SRAM. The memory controller 220 may be configured to control erase, read, and write operations of the flash memory 210.

The memory controller 220 may include at least one microprocessor 230, a host interface 250, a flash interface 260, and a buffer controller 270. The memory controller 220 may be configured to drive firmware for controlling the flash memory 210. The host interface 250 may interface with a host via the card protocol (e.g., the MMC protocol).

The memory controller 220 may further include a parallel stream filter which is formed of a filter manager 23, a merge filter 25, and a stream filter 26. In an exemplary embodiment, the merge filter 25 may be included in the host interface 250, and the stream filter 26 may be included in the flash interface 260. Further, the stream filter 26 may be configured to have the same constitution as illustrated in FIG. 3. In a case where the storage device 2000 includes a plurality of channels, the stream filter 26 may be provided to correspond to the plurality of channels, respectively.

Operations and constitutions of the filter manager 23, the merge filter 25, and the stream filter 26 may be identical to those described in FIGS. 1 to 7. Accordingly, identical constituent elements may be represented by the same reference numerals, and description thereof is thus omitted.

In accordance with a stream filtering operation of a parallel stream filter, search and update operations on a desired field may be carried out directly within a storage device 2000 without the intervention of a host. Accordingly, it is possible to reduce the burden of the host and an unnecessary data transfer between the storage device 2000 and the host, by processing a data search operation of the host within the storage device 2000.

The storage device 2000 may be applied to a multimedia card (MMC), a security digital card (SD, miniSD), a memory stick, a SmartMedia card, a TransFlash card, etc.

Figure 9:
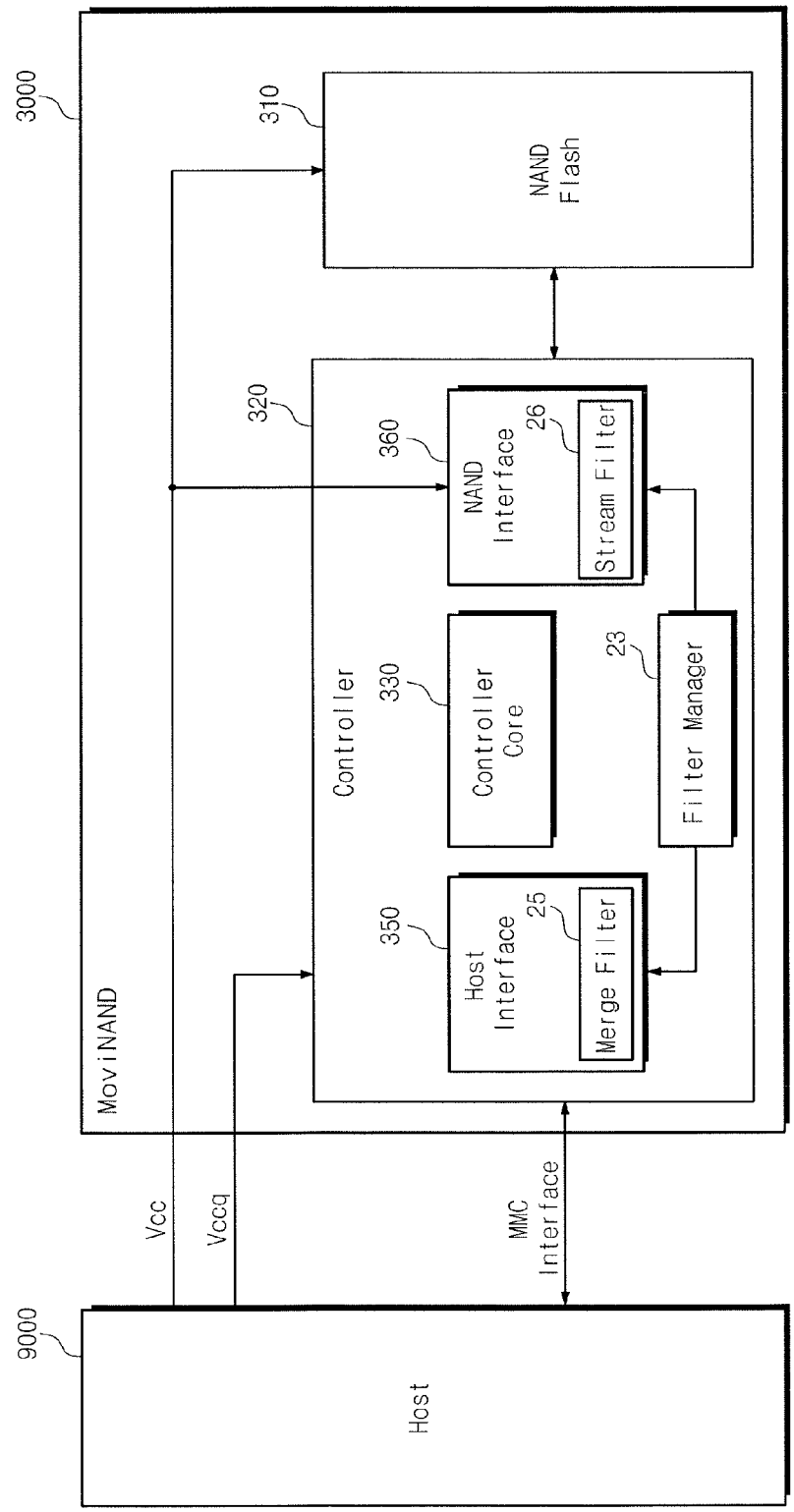
FIG. 9 illustrates a diagram showing a storage device according to another exemplary embodiment.

FIG. 9 is a diagram showing a storage device according to another exemplary embodiment. In FIG. 9, there is exemplarily illustrated an example that a storage device 3000 forms a moviNAND.

Referring to FIG. 9, a storage device 3000 may include a NAND flash memory 310 and a controller 320. The NAND flash memory 310 may be formed of one or more NAND flash memories which are stacked within one package (e.g., FBGA, Fine-pitch Ball Grid Array, etc.).

The controller 320 may include at least one controller core 330, a host interface 350, and a NAND interface 360. The controller core 330 may be configured to control an overall operation of the moviNAND 3000. In an exemplary embodiment, the host interface 350 may be configured to make a MMC interface with the host 9000. It is well understood that the MMC interface may be changed into different interface manners. The NAND interface 360 may provide an interface between the NAND flash memory 310 and the controller 320.

In the event that the storage device 3000 forms the moviNAND, the storage device 3000 may be supplied with power supply voltages Vcc and Vccq from the host 9000. Herein, the power supply voltage Vcc (e.g., 3V) may be supplied to the NAND flash memory 310 and the NAND interface 360, and the power supply voltage Vccq (e.g., 1.8V/3V) may be supplied to the controller 320.

The controller 320 may further include a parallel stream filter which is formed of a filter manager 23, a merge filter 25, and a stream filter 26. In an exemplary embodiment, the filter manager 23 may be included in the host interface 350, and the stream filter 26 may be included in the flash interface 360. Further, the stream filter 26 may be configured to have the same configuration as FIG. 3. In a case where the storage device 3000 includes a plurality of channels, the stream filter 26 may be provided to correspond to the plurality of channels, respectively.

In FIG. 9, operations and constitutions of the filter manager 23, the merge filter 25, and the stream filter 26 may be identical to those described in FIGS. 1 to 7. Accordingly, identical constituent elements may be represented by the same reference numerals, and description thereof is thus omitted.

With a stream filtering operation of a parallel stream filter, search and update operations on a desired field may be carried out directly within a storage device 3000 without the intervention of a host 9000. Accordingly, it is possible to reduce the burden of the host 9000 and an unnecessary data transfer between the storage device 3000 and the host 9000, by processing a data search operation of the host 9000 within the storage device 3000.

Figure 10:
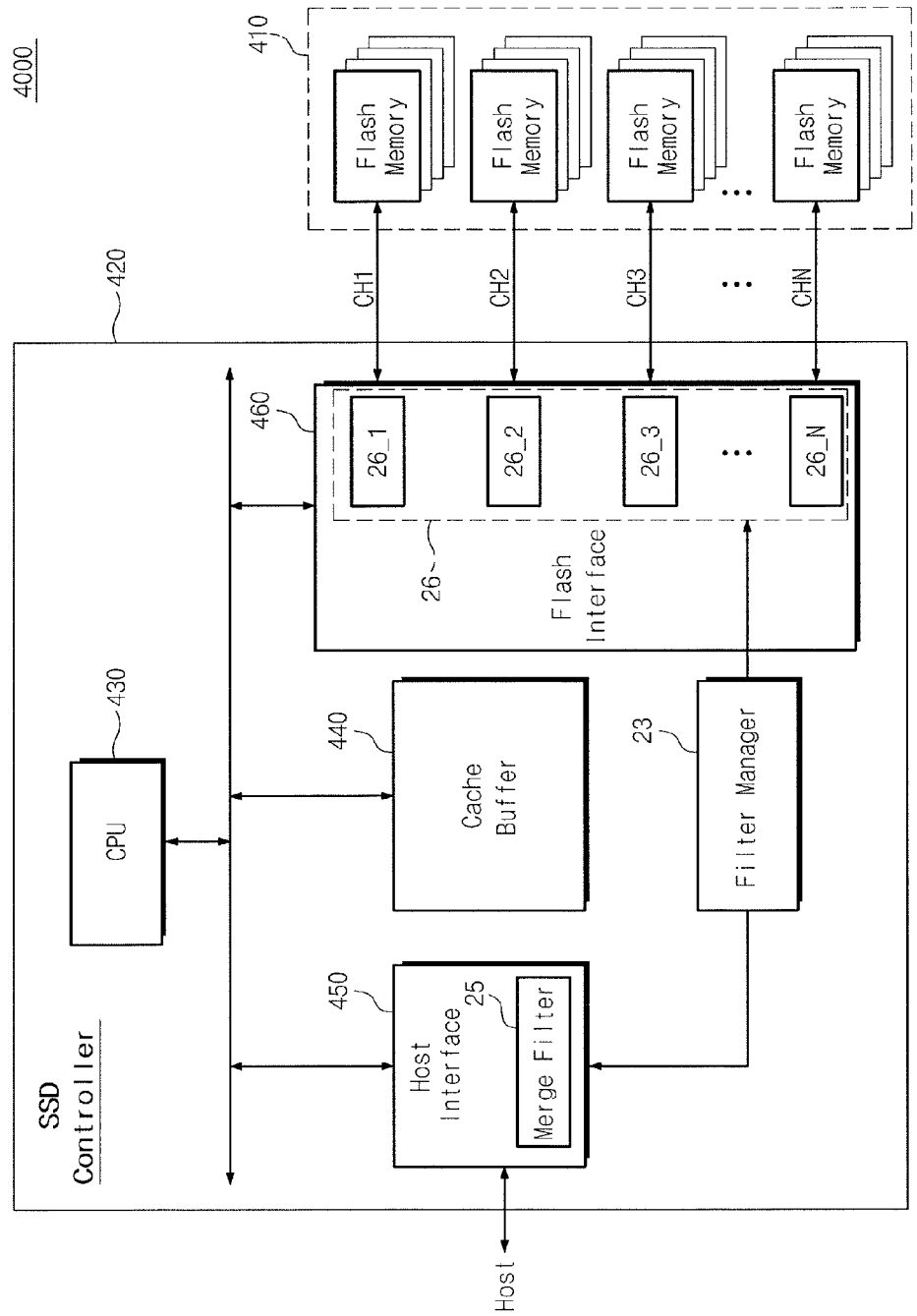
FIG. 10 illustrates a diagram showing a storage device according to yet another exemplary embodiment.

FIG. 10 is a diagram showing a storage device according to another exemplary embodiment. In FIG. 10, there is exemplarily illustrated an example that a storage device 4000 in FIG. 10 forms a solid state drive (SSD).

Referring to FIG. 10, the storage device 4000 may include a plurality of flash memories 410 and an SSD controller 420. Each of the plurality of flash memories 410 may be configured to be identical to that illustrated in FIG. 2.

The SSD controller 420 may include at least one CPU 430, a host interface 450, a cache buffer 440, and a flash interface 460. The host interface 450 may exchange data with a host in a standardized interface manner according to the control of the CPU 430. Herein, the standardized interface manner may include ATA, SATA, SAS, PATA, USB, SCSI, ESDI, IEEE 1394, IDE, PCI-express, and/or a card interface.

Data provided from the host or to be sent thereto via the host interface 450 may be transferred to a cache buffer 440 without passing through a CPU bus under the control of the CPU 430.

The cache buffer 440 may store data transferred between an external device (e.g., a host) and the flash memories 410 temporarily. Further, the cache buffer 440 may be used to store programs to be executed by the CPU 430. The cache buffer 440 may be considered to be a type of buffer and formed of SRAM, etc.

The flash interface 460 may provide an interface between the flash memories 410 used as a main storage part and the SSD controller 420.

The SSD controller 420 may further include a parallel stream filter which is formed of a filter manager 23, a merge filter 25, and a stream filter 26. In an exemplary embodiment, the merge filter 25 may be included in the host interface 450, and the stream filter 26 may be included in the NAND interface 460. Further, the stream filter 26 may be configured to have the same configuration as FIG. 3. In a case where the storage device 4000 includes a plurality of channels, the stream filter 26 may be provided to correspond to the plurality of channels, respectively.

In FIG. 10, operations and constitutions of the filter manager 23, the merge filter 25, and the stream filter 26 may be identical to those described in FIGS. 1 to 7. Accordingly, identical constituent elements may be represented by the same reference numerals, and description thereof is thus omitted.

With a stream filtering operation of a parallel stream filter, search and update operations on a desired field may be carried out directly within a storage device 4000 without the intervention of a host. Accordingly, it is possible to reduce the burden of the host and an unnecessary data transfer between the storage device 4000 and the host, by processing a data search operation of the host within the storage device 4000.

Figure 11:
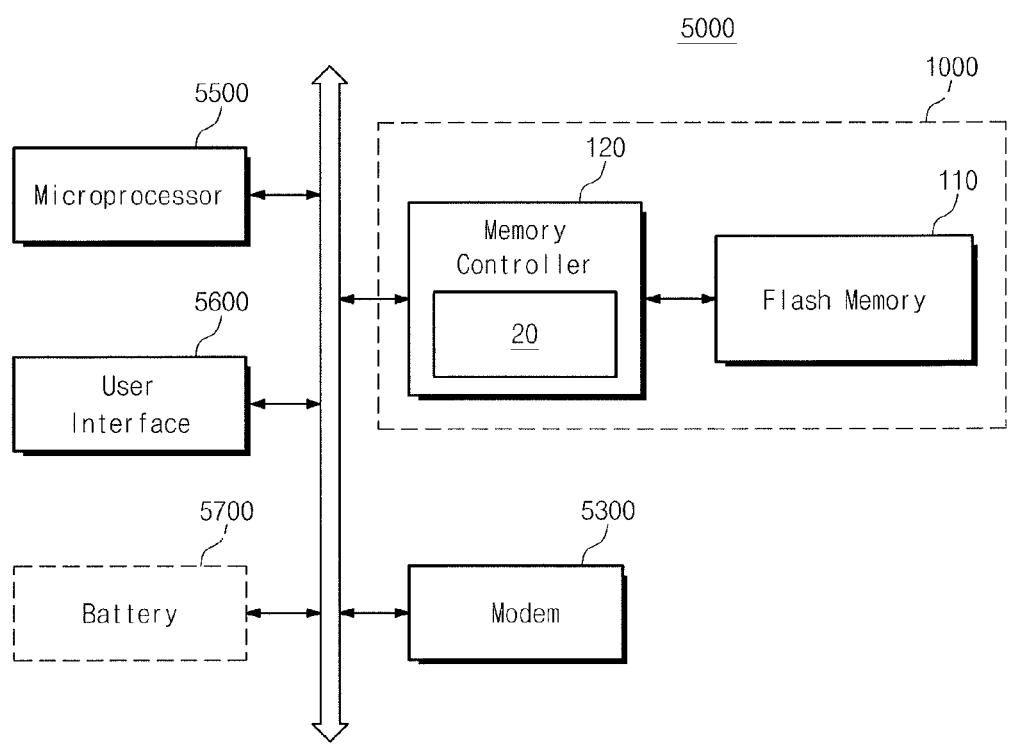
FIG. 11 illustrates a diagram showing a computing system including a storage device illustrated in FIG. 1.

FIG. 11 is a diagram showing a computing system including the storage device illustrated in FIG. 1.

Referring to FIG. 11, a computing system 5000 may include a flash memory 110, a memory controller 120, a modem 5300 such as a baseband chipset, a microprocessor 5500, and a user interface 5600.

The flash memory 110 may be a non-volatile memory device which retains data even at power-off. The flash memory 110 may be widely used as data storage and code storage for retaining stored contents at power-off The flash memory 110 may be applied to mobile devices, e.g., cellular phone, PDA digital camera, portable gate console, and MP3P. The flash memory 110 may further be applied to home applications such as HDTV, DVD, router, and GSP.

The memory controller 120 may include a parallel stream filter 20 which performs a data processing operation, being executed by a host, in parallel. Operations and constitutions of the parallel stream filter 20 in FIG. 11 may be identical to those described in FIGS. 1 to 7. Further, the storage device 1000 illustrated in FIG. 11 may be configured to be identical to that illustrated in FIG. 1. It is well understood that it is possible to replace the storage device 1000 in FIG. 11 with one of the storage devices 2000, 3000, and 4000 in FIGS. 8 to 10. Accordingly, identical constituent elements may be represented by the same reference numerals, and description thereof is thus omitted.

The storage device 1000 in FIG. 11 may form a memory card, a memory card system a solid state drive/disk, etc. In this case, the memory controller 120 may be configured to communicate with an external device (e.g., a host) by one of various interface protocols such as an universal serial bus (USB) interface, an MultiMediaCard (MMC) interface, an PCIExpress (PCI-E) interface, a serial AT Attachment (SATA) interface, a parallel ATA (PATA) interface, a Small Computer System Interface (SCSI), a Serial Attached SCSI (SAS), an Enhanced Small Disk Interface (ESDI), an Integrated Drive Electronics (IDE) interface, etc.

In a case where the computing system 5000 is a mobile device, the computing system 5000 may further include a battery 5700 for supplying an operating voltage thereto. Although not illustrated in FIG. 11, the computing system 5000 may further include an application chipset, a camera image processor (CIS), a mobile DRAM, etc.

A flash memory and/or a memory controller according to exemplary embodiments may be packed using various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flat-pack (TQFP), System In Package (SIP), Multi Chip Package (MCP), Wafer-level Fabricated Package (WFP), Wafer-Level Processed Stack Package (WSP), etc.

In an exemplary embodiment, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

Figure 12:
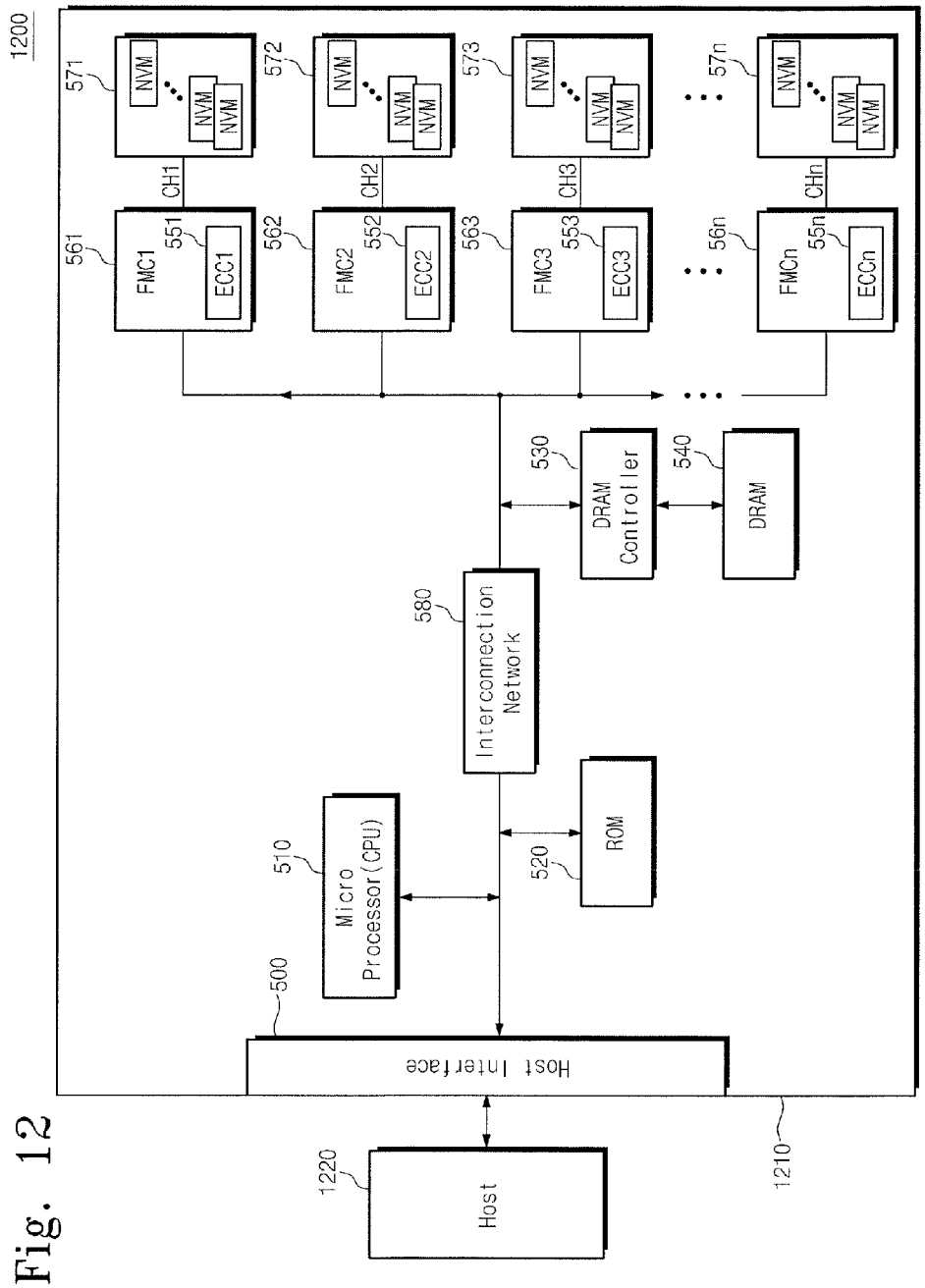
FIG. 12 illustrates a block diagram showing entire user device according to an exemplary embodiment.

FIG. 12 illustrates a block diagram showing entire user device 1200 including a storage device 1210 and a host 1220 according to some exemplary embodiments.

The host 1220 is configured to control the storage device 1210. The host 1220, for example, may include computing system, personal computer, portable computer, Personal Digital Assistant (PDA), portable media player (PMP), and MP3 player. The host 1220 and the storage device 1210 may be connected via a standard interface, e.g., USB, SCSI, ESDI, SATA, SAS, PCI-E, IDE, and so forth.

Referring to FIG. 12, storage device 1210, for example, may include Solid State Disk (SSD). The storage device 1210 may include a microprocessor 510, a host interface 500, a read only memory (ROM) 520, a dynamic access memory (DRAM) 540, a DRAM controller 530, a plurality of non-volatile memory devices (571, 572, . . . 57n), non-volatile memory controllers (561, 562, . . . 56n). The elements of the storage device 1210 may electronically communicate with each other via an interconnection network 580. As illustrated in FIG. 12, each non-volatile memory devices (571, 572, . . . 57n) may include a plurality of non-volatile memories NVM.

The microprocessor 510 generally controls the data storage device 1210. Power applied to the data storage device 1210 and the microprocessor 510 enables firmware, which is used for data storage operation, to be loaded into DRAM 530. Referring to FIG. 12, firmware code may be stored in, for example, ROM 520 or may be stored in non-volatile memory devices (571, . . . 57n) such as NOR Flash memory devices and NAND Flash memory devices, and then may be loaded into the DRAM 530.

The controlling of the microprocessor 510 may be interfered with by software, for example, firmware operation. The microprocessor 510 is configured to control the non-volatile memory controller (561, 562, . . . 56n), to reprocess the data provided from the first memory controller, and to provide the reprocessed data to the host 1220. The microprocessor 510 is connected to the non-volatile memory controller (561, 562, . . . 56n), through the interconnection network 580.

The host interface 500 provides interface between the host 1220 and the storage device 1210 based on protocol. The host interface 500 may be connected by a standard interface, such as USB, SCSI, ESDI, SATA, PCI-E, IDE, and so forth.

The host interface 500 may receive data processing code information from the host 1220 and provide the non-volatile memory controllers (561, 562, . . . 56n) with data processing code information The ROM 520 may store firmware code. However, the firmware code may be stored in variety type of non-volatile memory devices (571, . . . 57n).

The DRAM 540 may store an initial command from the host 1220, data from the host 1220, parameters, data to be programmed into non-volatile memory controller (561, 562,. . . 56n), and/or data read from non-volatile memory controller (561, 562, . . . 56n). The DRAM controller 530 may enable DRAM 540 to temporarily store data received from the host 1220 or non-volatile memory device (571 . . . 57n).

Non-volatile memory devices (571 . . . 57n) may serve as a main data storage area in order to store data received from host 1220. According to an exemplary embodiment, memory cells in the non-volatile memory devices (571 . . . 57n) are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc. Non-volatile memory device (571, . . . 57n) may include a variety of non volatile memory devices, such as PRAM, FRAM, MRAM, and so forth. According to another exemplary embodiment, non-volatile memory device (571, . . . 57n) may store data processing code information and the memory controller (561, 562, . . . 56n) may read the data processing code information from the non-volatile memory device (571, . . . 57n).

Non-volatile memory controllers (561, 562, . . . 56n) are connected to the non-volatile memory devices (571, . . . 57n) by channels (CH1, CH2 . . . CHn). Non-volatile memory controllers (561, 562, . . . 56n) generally control the non-volatile memory devices (571, . . . 57n). According to exemplary embodiments, a first channel is connected to at least one first non-volatile memory device 571. The first memory controller 561 is configured to receive a data processing code information from the host 1220, to load the data processing code information to the DRAM 540, and to perform data processing using the at least one first non-volatile memory devices 571 according to the data processing code information.

Non-volatile memory controllers (561, 562,. . . 56n) may provide read or program command (CMD) to the non-volatile memory devices (571, . . . 57n). Non-volatile memory controllers (561, 562, . . . 56n) may be configured to perform a function of dynamic memory access (DMA) in order to transfer data between non-volatile memory devices (571, . . . 57n) and the DRAM 540.

According to an exemplary embodiment, non-volatile memory controller (561, 562, . . . 56n) may be configured to perform entirely or partially data processing (or information processing) corresponding to the non-volatile memory device (571, . . . 57n) instead of the host 1220. According to another exemplary embodiment, non-volatile memory controllers (561, . . . 56n) may include high performance data storage device (1210).

ECC engines (551, 552 . . . 55n) may perform error correction code to correct error bits received from non-volatile memory devices (571, . . . 57n). The ECC engines (551, 552 . . . 55n) may physically be located inside or outside the non-volatile memory controllers (561, . . . 56n). The ECC engines (551, 552 . . . 55n) may detect an error location among read data from non-volatile memory device (571, . . . 57n) and may perform the error correction algorithm. ECC engines (551, 552 . . . 55n) may encode data to be programmed and form an ECC data (i.e. parity bit) or meta data. ECC data generally may be stored to the spare region in non-volatile memory devices (571, . . . 57n. In addition, The ECC engines (551, 552 . . . 55n) may detect the error location and correct the error bit using the ECC data. The ECC engines (551, 552 . . . 55n) may use LDPC (low density parity check) code, BCH code, turbo code, RS code (recursive systematic code), TCM (trellis-coded modulation), BCM (Block coded modulation), and so forth.

The interconnection network 580 enables the elements of data storage device 1210 to be electrically connected. The interconnection network 580 may connect the microprocessor 510 to the plurality of non-volatile memory devices (571, . . . 57n). The interconnection network 580 may include, for example, a bus, a cross bar switch, a ring bus, and the like. The interconnection network 580 may be differently configured base on a variety of topologies. The interconnection network 580 may enable non -volatile memory controllers (561, 562 . . . 56n) to access the DRAM 540 through the DRAM controller 530.

Figure 13:
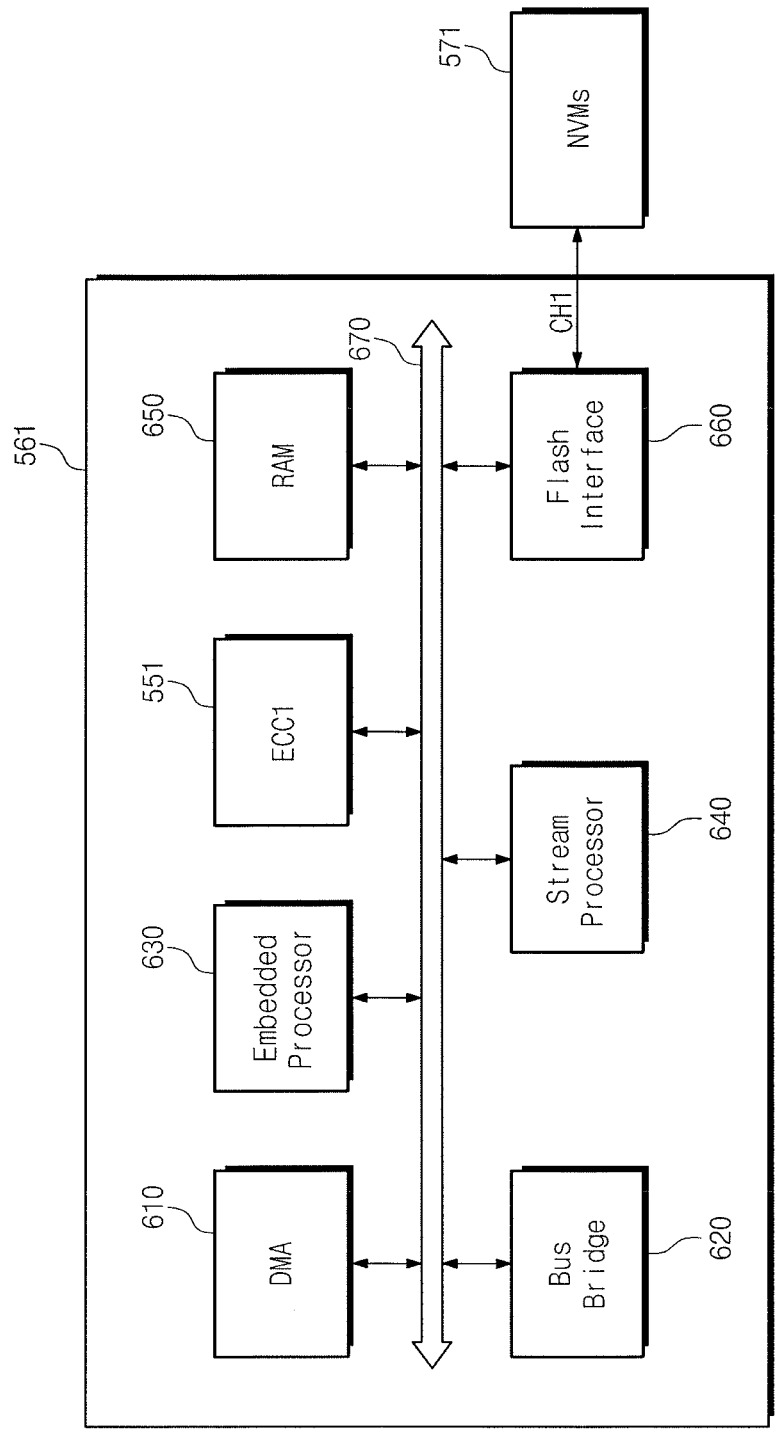
FIG. 13 illustrates a block diagram showing non volatile memory controller in FIG. 12.

FIG. 13 illustrates a block diagram showing non volatile memory controller 561 in FIG. 12. Referring to FIG. 13, the non-volatile memory controller 561 includes a direct memory access (DMA) 610, a bus bridge 620, a RAM 650, an embedded processor 630, a stream processor 640, and a flash interface 660. The elements (610, 620, 630, 640, 650, 660) of the non-volatile memory controller 561 are electrically connected, for example, via a bus or an interconnect network 670. The elements may communicate with one another by the interconnect network 670.

The DMA 610 is configured to transfer data between the non-volatile memory device 571 and the RAM (DRAM or SRAM) 650.

The bus bridge (620) is configured to serve as an interface in order to connect the non-volatile memory device 571 to the interconnect network 670. In other words, the bus bridge 620 may manage the connection with both the bus 670, which connects the elements in the non-volatile memory controllers (561, 562 . . . , 56n), and an external bus of the non-volatile memory controllers (561~56n).

The RAM 650 is configured to temporarily store data which the stream processor 640 may process. The RAM 650 may include DRAM or SRAM. The RAM 650 temporarily stores data received from the first non-volatile memory device 571 or data to be programmed to the first non-volatile memory device 571.

The embedded processor 630 is configured to generate commands for read, program, and erase operation. The embedded processor 630 is configured to provide the non-volatile memory device 571 with the commands and to control basic operations of the non-volatile memory device 571.

The flash interface 660 is configured to provide fundamental bus protocols which enables non-volatile memory controller 561 to access the non-volatile memory device 571. The flash interface 660 performs a kind of interface between the non-volatile memory controller 561 and the non-volatile memory device 571. The flash interface is connected to an I/O of the non-volatile memory device 571 and transfers data back and forth between the non-volatile memory device 571 and the non-volatile memory controller 561. The flash interface 660 may form command corresponding to the non-volatile memory device 571 and provide the I/O of the non volatile memory device 571 with the command. The flash interface 660 is configured to provide the command and address to the non-volatile memory device 571.

The stream processor 640 is configured to perform a specific command in order to process data received from the non volatile memory device 571 or data to be programmed to the non-volatile memory device 571. The data to be processed related to the non-volatile memory device 571 may be temporarily stored in the RAM 650. The stream processor 640 connected to the first channel CH1 is configured to receive data processing code information from the host (1220) and to load the processing code information. The stream processor 640 in part or entirely performs data processing using the non volatile memory device 571 according to the data processing code information. The stream processor 640 may transfer data from non-volatile memory device 571 to the host 1220. The stream processor 640 is configured to perform data processing in part or entirely instead of the host 1220. Alternatively, the stream processor 640 is configured to process data from the non-volatile memory device 571 instead of the host 1220. In other words, the stream processor 640 is configured to perform data processing using the non-volatile memory device 571 instead of the host 1220. The stream processor 640 may include Application Specific Instruction-Set Processor (ASIP), Application Specific integrated Circuits (ASIC), or field-programmable gate array (FPGA).

Referring to FIG. 12 and FIG. 13, each of a plurality of non-volatile memory controller (561, 562 . . . 56n) connected to each channels (CH1, CH2, CH3, . . . , CHn) may include a stream processor.

The first channel may be connected to more than one non-volatile memory device 571. The first memory controller 561 may be connected to the first channel CH1 and may include the first processor or first stream processor 640 which performs data processing using the first non-volatile memory device 571 in part or entirely instead of the host.

In addition, the second channel CH2 may be connected to more than one non-volatile memory device 572. The second memory controller 562 may be connected to the second channel CH2 and may include the second processor or second stream processor 640 which performs data processing using the second non volatile memory device 572 in part or entirely instead of the host 1220. The first and second processors may be stream processors.

The embedded processor 630 is configured to control the first memory controller 561 and reprocess data received from the first memory controller 561.

Figure 14:
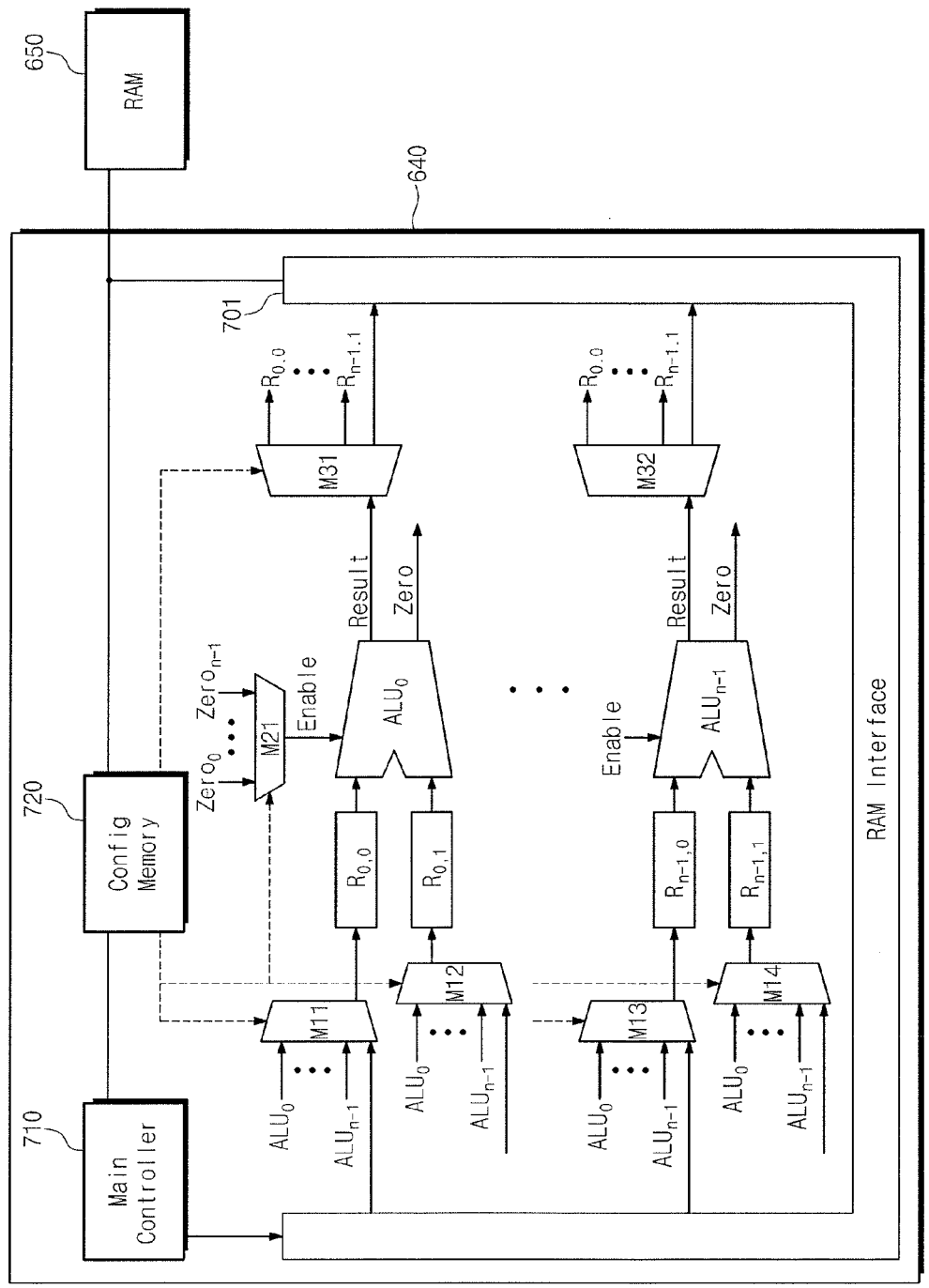
FIG. 14 illustrates a block diagram showing stream processor and random access memory shown in FIG. 13.

FIG. 14 illustrates a block diagram of the stream processor 640 and the RAM 650 shown in FIG. 13. The stream processor 640 includes a plurality of arithmetic logic units (ALU0~ALUn−1), a configuring memory device 720, a main controller 710, a RAM interface (701), a plurality of registers (R0~Rn−1), data multiplexers (M11~M14), an instruction multiplexer M21, and data de-multiplexers (M31~M32). As described in FIG. 13, the RAM 650 may serve as a buffer which temporarily stores data to be processed by the stream processor 640. The RAM 650 may include DRAM or SRAM.

The stream processor 640 may be configured as Application Specific Instruction-Set Processor (ASIP), Application Specific integrated Circuits (ASIC), or field-programmable gate array (FPGA).

The arithmetic logic units (ALU0~ALUn−1) is configured to perform to arithmetic operation of data to be programmed or data received from the non-volatile memory device 571 instead of the host 1220. The arithmetic logic units (ALU0~ALUn−1) may be controlled by the main controller 710. The Arithmetic and Logic Units (ALU0~ALUn−1) may receive the data to be operated from a register ([R00] . . .[Rn−1,1]) and enable signal under the control of the main controller 710. Then, the arithmetic logic units (ALU0~ALUn−1) may perform arithmetic operations using the received data.

The configuring memory device 720 is configured to store the data processing code information from the host 1220. The configuring memory device 720 may store information to reorganize a connection between input data and output data. The configuring memory device 720 may also store the reorganized information when information is reorganized under the control of the main controller 710. The configuring memory device 720 may be, for example, DRAM, PRAM, FRAM, MRAM, ReRAM.

The main controller 710 is configured to control the configuring memory device 720, alter the data processing code, the data process, and the data process operation of the arithmetic logic units (ALU0~ALUn−1). The main controller 710 may, for example, change information stored in the configuring memory device 720 without any change of hardware structure of non-volatile memory controller. The main controller 710 may enable the non-volatile memory controller to perform various application algorithms. Thus, the stream processor 640 including the main controller 710 may increase storage device performance and prevent the host 1220 being overloaded.

The RAM interface 701 is configured to perform an interface between the RAM 650 and the stream processor 640. The RAM interface 701 may enable the stream processor (640) to communicate with data stored in the RAM (650). For example, register ([R00] . . . [Rn−1,1]) is connected to the arithmetic logic units (ALU0~ALUn−1), store data received from multiplexers (M11~M14), and provide the arithmetic logic device units (ALU0~ALUn−1) with the received data.

The data multiplexer M12 is configured to be provided with selected signal under the control of the main controller 710 and select one data among a plurality of data. Then, the data multiplexer M12 may provide the selected data to register (R0, 1).

The instruction multiplexer M21 is configured to select one enable signal according to a selection signal under the control of the main memory and provide the arithmetic logic units (ALU0~ALUn−1) with one selected enable signal.

The data demultiplexer M31 is configured to receive a selection signal and data from the arithmetic logic device under the control of the main controller 710. The data demultiplexer M31 is configured to provide a plurality of data with the RAM 650 or the configuring memory device 720 according to a selection signal.

The stream processor 640 includes the arithmetic logic units (ALU0~ALUn−1) which perform arithmetic operations using non-volatile memory devices, the configuring memory device 720 to store the data processing code information from the host 1220, and the main controller 710 configured to control the configuring memory device720, to alter the data processing code and the data process, and to control the data process operation of the arithmetic logic units (ALU0~ALUn−1). The arithmetic logic units (ALU0~ALUn−1) are configured to perform data processing of the non-volatile memory device according to the data processing code stored in the configuring memory device 720. The stream processor 640 further includes multiplexers configured to receive a selection signal under the control of the main controller 710 and select one of data according to the selection signal. In addition, the stream processor 640 further includes the instruction multiplexer M21 configured to receive a selection signal under the control of the main controller 710, to select one of a plurality of instruction signals from the configuring memory device 720, and to provide an enable signal corresponding to the selected instruction to the arithmetic logic units (ALU0~ALUn−1). The data demultiplexer M31 in the stream processor 640 is configured to receive a selection signal under the control of the main controller 710, to receive processed data by the arithmetic logic units (ALU0~ALUn−1) and to provide a plurality of data to the RAM 650 or another arithmetic logic units (ALU0~ALUn−1) to perform another arithmetic operation.

Figure 15:
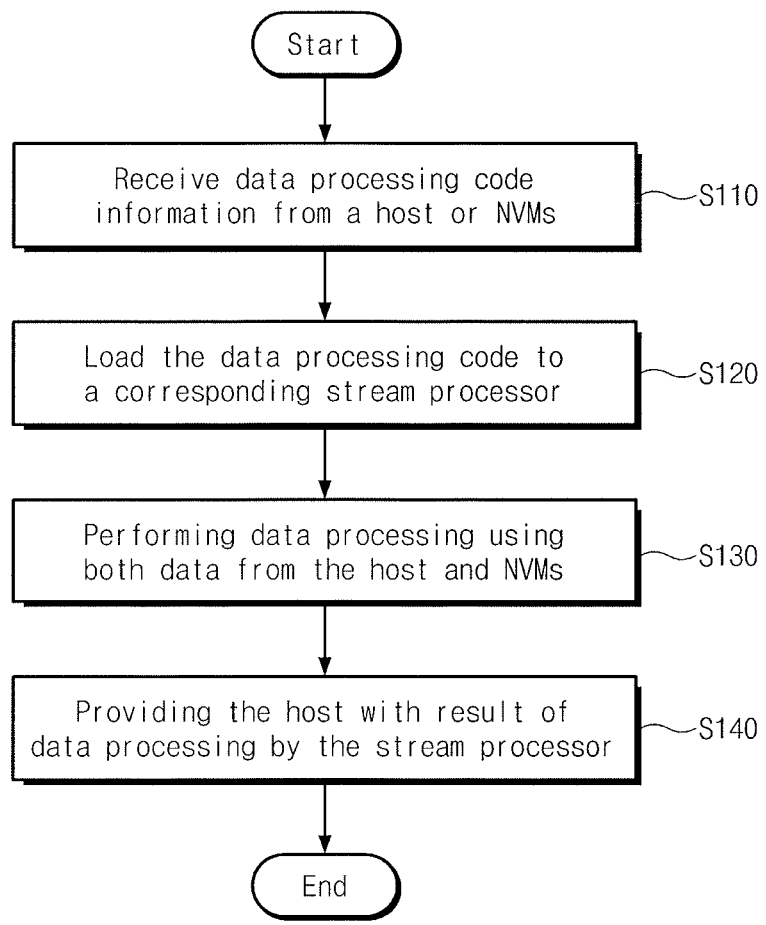
FIG. 15 illustrates a flow chart showing operation method of the storage device.

FIG. 15 illustrates a flow chart showing operation method of the storage device 1210. Referring to FIG. 14 and FIG. 15, the storage device 1210 may receive data processing code information from the host 1220 (S110). Or the storage device 1210 may receive data processing code information from non-volatile memory device (571~57n). The data processing code may include configuration parameter and determine a function of microprocessor 510 or stream processor 640. The configuration parameter firstly may be default values (for example, IO function storage) that are predetermined in manufacturing process and may be read when the computing system is booted. However, the configuring value may be changed and set in response to host requests. Referring to FIG. 12, FIG. 14, and FIG. 15, the configuration parameters may be stored in the DRAM 540, the RAM 650, the non-volatile memory devices(571~57n), the microprocessors (510), and/or registers ([R00] . . . [Rn−1,1]) in the stream processor 640.

The storage device 1210 may load the data processing code or configuration parameters received from the host to the corresponding stream processor 640 (S120). The stream processor 640 may perform data processing using both data from the host and the non-volatile memory devices (571~57n) (S 130). Thus, according to configuring parameters, the microprocessor 510 or the stream processor 640 may perform arithmetic operations (for example, search or multiply) using read data from the non-volatile memory devices (571~57n) or data to be programmed. According to exemplary embodiments, the storage device 1210 may serve as various computing devices.

The storage device 1210 may provide the host 1220 with the result of data processing by the stream processor 640 (S140). The computing system receives a result of data processing by the stream processor 640. Or, the storage device 1210 may provide the non-volatile memory device with the result of data processing by the stream processor 640 and the non-volatile memory device may program the result of data processing.

Figure 16:
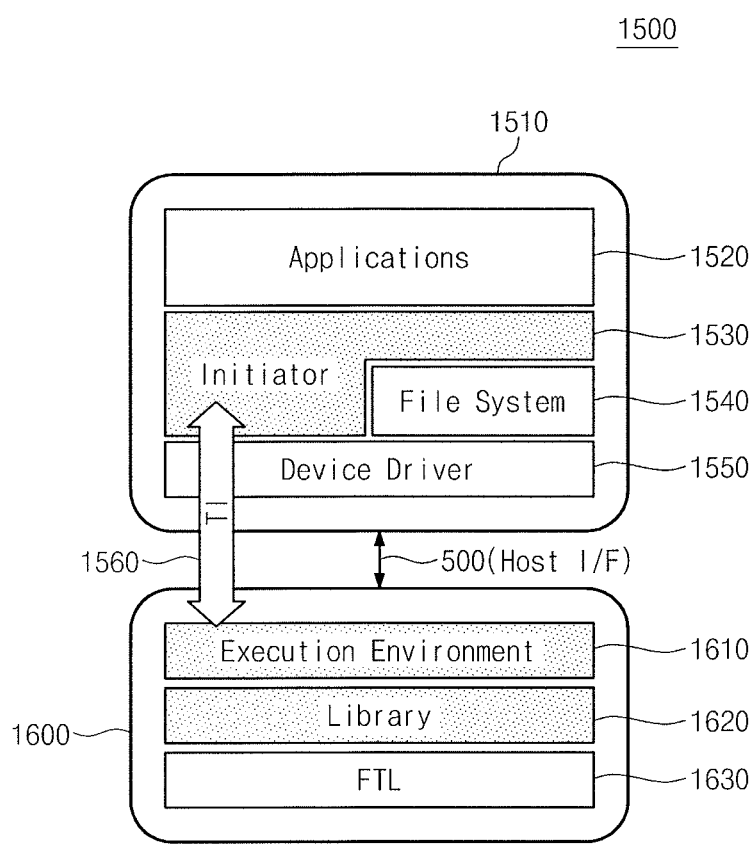
FIG. 16 illustrates software layer structure of host and storage device according to an exemplary embodiment.

FIG. 16 illustrates software layer structure of the host 1220 and the storage device 1210. Referring to the FIG. 16, software structure includes a host software structure 1510 and a storage memory device software structure 1600. The host software may be performed by the host 1220 in FIG. 12.

Referring to FIG. 16, the host software structure 1510 includes an application layer 1520, an initiator layer 1530, a file system 1540, and device driver 1550.

Referring to FIG. 12 and FIG. 16, the initiator layer 1530 may provide library which determines whether the host 1220 uses the file system 1540 or the stream processor 640. The initiator layer 1530 may determine whether the host 1220 performs an operation, e.g., arithmetic operation, search operation, scan operation, or the storage device 1210 performs this operation, and provides a result of the determination to the application layer 1520. When the initiator layer 1530 determines that the storage device performs the operation, the initiator layer 1530 may provide parameters and library information needed for operation execution to application layer to an application layer 1520. The library may include a group of software code. The library enables the application layer 1520 to perform a function corresponding to the library Information. For example, when initiator layer 1530 decides that the storage device 1210 is to perform a search operation, the initiator layer 1530 may provide parameters, operation code for a search, or the library information of search operation to the storage device 1210 through a tunneling interconnector 1560 or the device driver 1550.

The application layer 1520 may include a database, data mining, and an application program (for example, search or scan). When the application layer 1520 uses the file system 1540. the initiator layer 1530 may provide library information interlocked with the file system 1540 and device driver 1550 to the host 1220. However, when the application layer 1520 does not use the file system 1540, the initiator layer 1530 provides library information interlocked with device driver 1550 to the host 1220. The application layer 1520 allows the storage device 1210 to perform an operation corresponding to the library information, e.g., an arithmetic operation, a scan operation, a search operation, and the like.

The file system 1540, for example, includes a file allocation table (FAT), a new technology file system (NTFS), second and third extension file systems, i.e. ext2 and ext3.

The device driver 1550 may serve as an interface between application the application layer 1520, the file system 1540, and the storage device 1210.

The storage device software layer structure 1600 includes an execution environment layer 1610, a library 1620, and a flash translation layer (FTL) 1630. The storage device software layer structure 1610 is performed by the memory controllers (561, 562, ... 56n) in FIG. 12.

The FTL 1630 may translate a logical address from the host 1220 to a physical address corresponding to non volatile memory devices (571, 572, ... 57n).

The execution environment layer 1610 may communicate with the FTL 1630. The execution environment layer 1610 may be performed when execution library information, a parameter, or operation code are provided by the host 1220 through the host interface 500. The execution environment layer 1610 may provide a service which enables the storage device 1210 to perform an operation corresponding to the library information using library from the initiator layer 1530 to the storage device 1210. When the execution information is stored in the storage device 1210 and an execution command is provided from the host 1220, the execution environment layer 1610 may enable the storage device 1210 to perform an operation, e.g., an arithmetic operation, a search operation, a scan operation, and the like, without providing library information from the host 1220. Thus, the execution environment layer 1610 independently performs execution code from the host 1220 or enables the storage device 1210 to perform execution code stored in the storage device 1210. The execution environment layer 1610 may include an operating system, e.g., a Java virtual machine or Linux.

The tunneling interconnector 1560 may perform tunneling operation which allows the host 1220 and the storage device 1210 to communicate commands, parameters, code, data, and the like, without a limitation of standard host interfaces, e.g., USB, SCSI, ESDI, SATA, SAS, PCI-express, or IDE interface, or Ethernet. Thus, the tunneling may serve to insure compatibility between the host interface 500 and the device driver 1550. Tunneling may be performed by modifying additional commands and parameters or adding additional commands and parameters.

Based on a type of host interface, a vendor command is provided to the host interface 500 in order to add a command. Using the vendor command, a command and data, which the tunneling interconnector 1560 may implement, are communicated between the host 1220 and storage device 1210.

The library layer 1620 may include a class or a subroutine which is stored in the storage device 1210. For example, the library layer 1620 may store programs for scan or search and provide the library corresponding to a function which the execution layer is willing to perform in the execution layer if necessary. The execution environment layer 1610 can enable the storage device 1210 to perform a specific operation (for example, scan or search) corresponding to the provided library from the library layer 1620.

Figure 17:
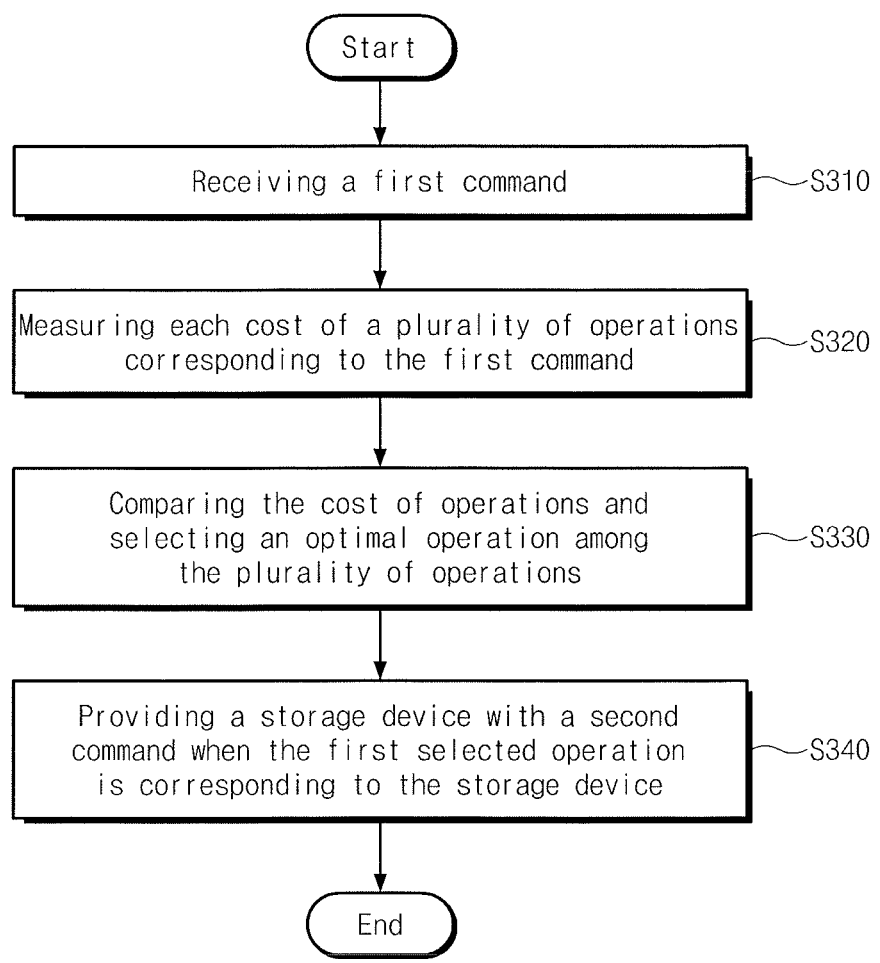
FIG. 17 illustrates a flow chart showing a method of showing operation a computing system according to another an exemplary embodiment.

FIG. 17 illustrates a flow chart showing a method of operating a computing system according to an exemplary embodiment. The computing system may be configured to perform parallel data processing according to one exemplary embodiment.

Referring to FIG. 17, a host may be configured to receive a first command from user (S310). The host or host processor may be configured to measure each cost of a plurality of operations corresponding to the first command (S320).

The host may select an optimized operation based on the measured operation costs. The host is configured to compare the cost of operations and selecting an optimal operation among the plurality of operations (S330). The operation cost may include the operation time referring to a database table corresponding to the first command. To the specific, the host may compare each measured cost and select the least cost operation. For example, when search command is received by the user, the host may measure storage device's search operation cost and host's search operation cost. Then, the host may compare the former cost to the latter cost and the host may select the least cost operation.

When the host selects operation of storage device, the host may provide a second command with the storage device (S340). The second command is corresponding to storage device. For example, the host may provide the search operation command with the storage device. The storage device may perform operation such as search operation independently.

Figure 18:
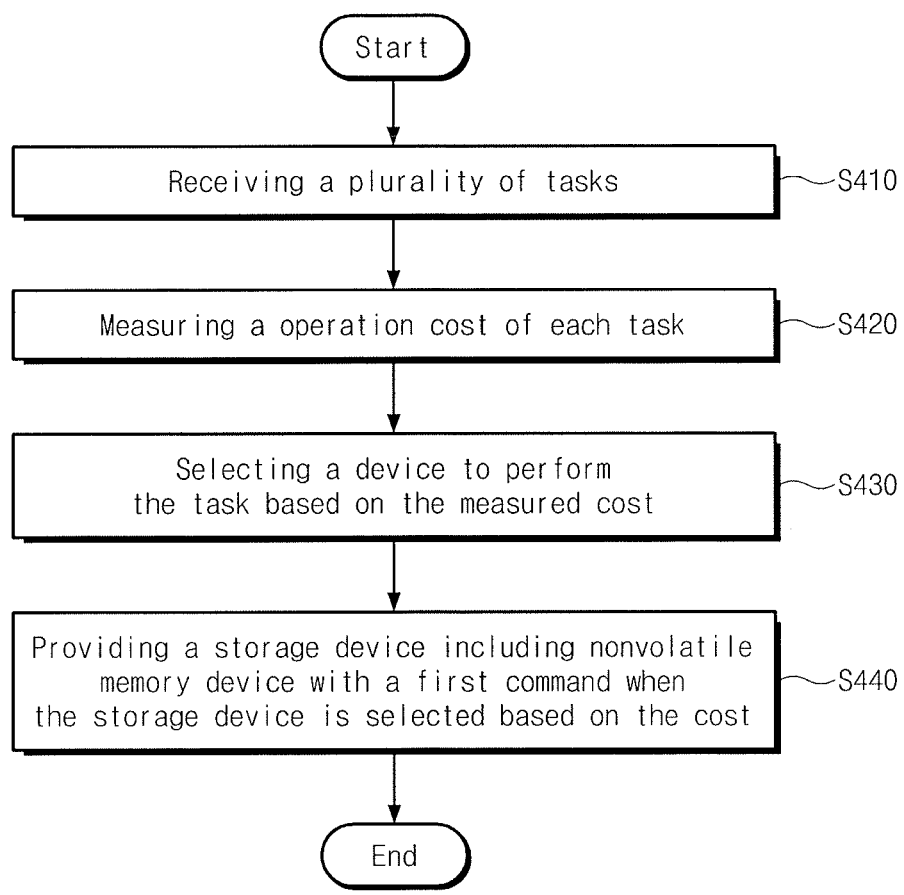
FIG. 18 illustrates a flow chart showing a method of showing operation a computing system according to an exemplary embodiment.

FIG. 18 illustrates a flow chart showing a method of showing operation a computing system according to an exemplary embodiment. The computing system may be configured to perform parallel data processing according to an exemplary embodiment.

Referring to FIG. 18, a host may receive a plurality of tasks from the user (S410). The host is configured to measure an operation cost of task (S420). The cost may include an operation time. On the basis of the measured cost, the host may select a device to perform the task (S430). To be specific, when the host selects the device to perform the task, host may perform to search the least cost consuming device for the task. The host may provide a first command with a storage device including non volatile memory device when the storage device is selected based on the cost (S440). The storage device includes a plurality of non volatile memory device and a stream processor which enables the storage device to perform the task independently.

Figure 19:
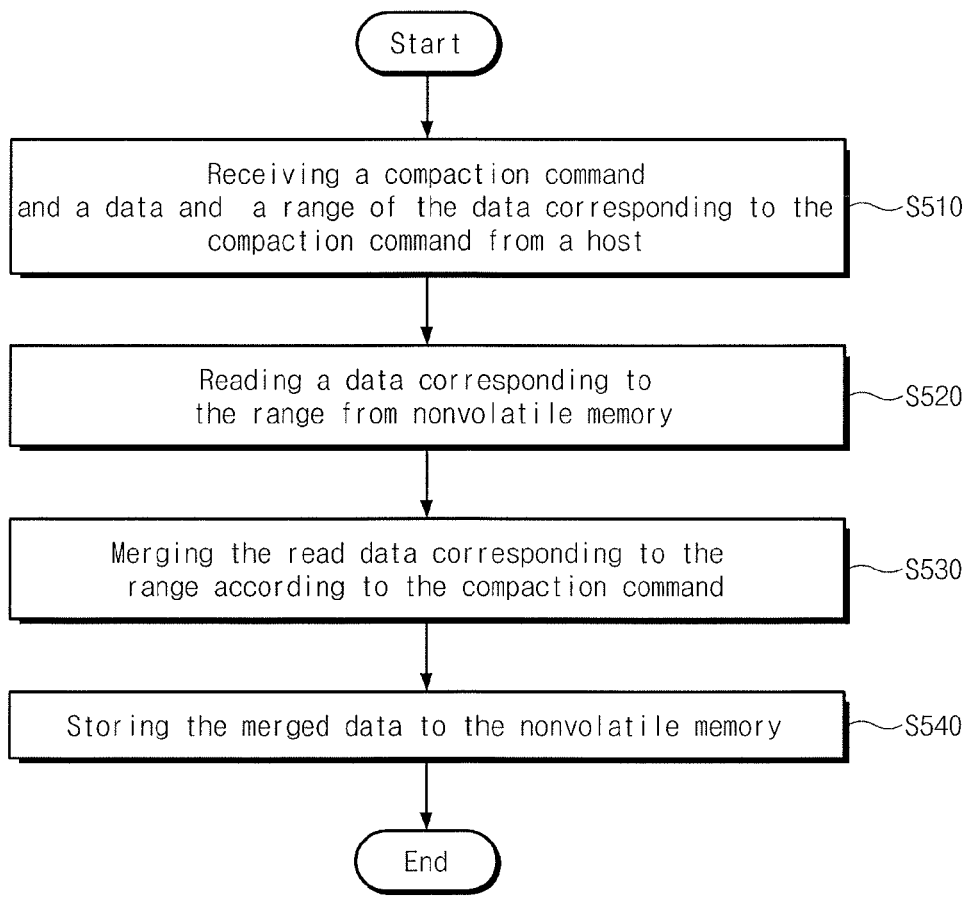
FIG. 19 illustrates a flow chart showing compaction operation of storage device according to an exemplary embodiment.

FIG. 19 illustrates a flow chart showing compaction operation of storage device according to an exemplary embodiment. Referring to FIG. 19, a storage device may receive a compaction command and a range of data corresponding to the compaction command from a host (S510). The storage device may be configured to read a data corresponding to the range from non-volatile memory (S520) and merge the read data corresponding to the range of data according to the compaction command (S530). The storage device is configured to erase the read data in the non-volatile memory device when merging the read data is performed. Then, the storage device may store the merged data in the non-volatile memory (S540).

FIG. 20 illustrates a flow chart showing operating an intelligent solid state driver including a non-volatile memory device according to an exemplary embodiment. The intelligent solid state storage (ISSD) may include include the storage device 561 including the stream processor 640. The ISSD may be configured to receive predetermined object information from the host 1210 (S610). The ISSD may be configured to read a first data and a second data from the non-volatile memory device according to the predetermined object information (S620). Then, ISSD may be configured to program the first data and the second data to the non-volatile memory device (S630). The first data and the second data are stored in a separate page in the non-volatile memory device. The ISSD may be configured to store the first data and the second data in an area different from a read area when ISSD performs to program the first data and the second data to the non-volatile memory device.

According to the embodiments described above, it is possible to process data in parallel by a plurality of stream filters within a storage device and to effectively merge results processed in parallel by the plurality of stream filters. As a result, a data processing function may be executed effectively within the storage device instead of a host. Thus, the burden of the host on data processing is reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A storage device, the storage device to be connected to a host, wherein the host receives a first command, measures costs of a plurality of operations corresponding to the first command, the costs of the plurality of operations including cost of an operation of the host and cost of an operation of the storage device, compares the costs of the plurality of operations and selects an optimal operation among the plurality of operations, and provides the storage device with a second command when the cost of the operation of the storage device is lower than that of the host, the storage device comprising:
   a first channel connected to at least one first non-volatile memory device; and
   a first memory controller for controlling the at least one first non-volatile memory device and including a first processor connected to the first channel, the first processor to be provided in the first memory controller to perform first data processing, wherein
   the first processor of the first memory controller is to receive the second command and a data processing code information being associated with the at least one first non-volatile memory device from the host, to load the data processing code information, and to generate first processed data by performing the second command, independently instead of the host, the first data processing on first original data being transferred from the at least one first non-volatile memory device or on first original data being transferred from the host according to the second command and the data processing code information being associated with the at least one first non-volatile memory device, and to provide the first processed data as a result of the first data processing to the host, and wherein
   the first processed data are modified from the first original data by the first data processing.

2. The storage device as claimed in claim 1, further comprising:
   a second channel connected to at least one second non-volatile memory device; and
   a second memory controller for controlling the at least one second non-volatile memory device and including a second processor connected to the second channel, the second processor to be provided in the second memory controller to perform second data processing, wherein
   the second processor of the second memory controller is to receive the second command and a data processing code information being associated with the at least one second non-volatile memory device from the host, to load the data processing code information being associated with the at least one second non-volatile memory device and to generate second processed data by performing, independently instead of the host, the second data processing on second original data being transferred from the at least one second non-volatile memory device or on second original data being transferred from the host according to the second command and the data processing code information being associated with the at least one second non-volatile memory device, and to provide the second processed data as a result of the second data processing to the host, and wherein
   the second processed data are modified from the second original data by the second data processing.

3. The storage device as claimed in claim 1, wherein the first processor is a stream processor.

4. The storage device as claimed in claim 3, wherein the stream processor comprises Application Specific Instruction-Set Processor (ASIP), Application Specific integrated Circuits (ASIC), or field-programmable gate array (FPGA).

5. The storage device as claimed in claim 1, further comprising:
   a host interface to connect the host and the storage device, the host interface providing the data processing code information with the first memory controller.

6. The storage device as claimed in claim 1, further comprising:
   a microprocessor to control the first memory controller, to reprocess the first processed data provided from the first memory controller, and to provide the reprocessed data to the host.

7. The storage device as claimed in claim 6, wherein the microprocessor is connected to the first memory controller through an interconnection network.

8. The storage device as claimed in claim 7, wherein the interconnection network comprises at least one of a bus or a cross bar switch.

9. The storage device as claimed in claim 1, wherein the first memory controller further includes a random access memory device to temporarily store data from the first memory controller.

10. The storage device as claimed in claim 1, wherein the first processor further includes:
    a plurality of arithmetic logic units;
    a configuring memory device to store the data processing code information from the host; and
    a main controller to control the configuring memory, to alter the data processing code information, and to control data processing of the arithmetic logic units.

11. The storage device as claimed in claim 10, wherein the arithmetic and logic unit is to perform data processing of the non-volatile memory device according to the data processing code information stored in the configuring memory device.

12. The storage device as claimed in claim 10, wherein the first processor further includes a multiplexer to receive a selection signal for selecting data according to the selection signal, the multiplexer being controlled by the main controller.

13. The storage device as claimed in claim 10, wherein the first processor further includes an instruction multiplexer to receive a selection signal under the control of the main controller, select one of a plurality of instruction signals from the configuring memory device, and provide an enable signal corresponding to the selected instruction to the arithmetic logic unit.

14. The storage device as claimed in claim 10, wherein the first processor further includes a data demultiplexer to receive a selection signal under the control of the main controller and processed data by the arithmetic logic unit, and provide multiple data to the host.

15. A method of operating a computing system, the computing system includes a host and a storage device, the method comprising:
   receiving a first command to the host;
   measuring costs of a plurality of operations corresponding to the first command by the host, the costs of the plurality of operations including cost of an operation of the host and cost of an operation of the storage device;
   comparing the costs of the plurality of operations by the host and selecting an optimal operation among the plurality of operations by the host;
   providing the storage device with a second command when the selected optimal operation corresponds to the storage device; and
   performing independently the second command instead of the host by the storage device and providing processed data as a result of the second command performance to the host by the storage device, wherein:
   the cost of the operation of the host is measured based on an operation time for executing the first command by the host, and
   the cost of the operation of the storage device is measured based on an operation time for executing the first command by the storage device, wherein
   the optimal operation is selected when the cost of the operation of the storage device is lower than that of the host, wherein
   the second command is associated with a data processing operation, wherein
   performing independently the second command instead of the host by the storage device includes generating the processed data by performing the data processing operation on original data being transferred from a plurality of non-volatile memory devices of the storage device or on original data being transferred from the host according to the second command being associated with the plurality of non-volatile memory devices, and wherein
   the processed data are modified from the original data by the data processing operation.

16. The method as claimed in claim 15, wherein measuring costs of the plurality of operations includes referring to an operation time in a database table corresponding to the first command.

17. The method as claimed in claim 15, further comprising:
   receiving a result of the second command operation from the storage device.

18. The method as claimed in claim 15, wherein the optimal operation is an operation with the least cost.

19. The method as claimed in claim 15, wherein the storage device includes the plurality of non-volatile memory devices and a stream processor which enables the storage device to perform the second command independently.

20. A method of operating a memory controller, the memory controller being connected to both a host and at least one non-volatile memory device and being to control the at least one non-volatile memory device, wherein the host receives a first command, measures costs of a plurality of operations corresponding to the first command, the costs of the plurality of operations including cost of an operation of the host and cost of an operation of the storage device, compares the costs of the plurality of operations and selects an optimal operation among the plurality of operations, and provides the storage device with a second command when the cost of the operation of the storage device is lower than that of the host, the method comprising:
   receiving the second command and a data processing code information being associated with the at least one non-volatile memory device from the host;
   loading the data processing code to a stream processor of the memory controller;
   translating the second command to the third command and providing the third command to the at least one non-volatile memory device;
   performing independently the second command by the stream processor of the memory controller instead of the host using original data, corresponding to the third command, from the at least one non-volatile memory device to generate processed data, the processed data being modified from the ordinal data by data processing on the original data according to the second command; and
   providing the processed data as a result of the first command performance to the host by the memory controller.

21. The method as claimed 20, wherein the stream processor comprises Application Specific Instruction-Set Processor (ASIP), Application Specific integrated Circuits (ASIC), or field-programmable gate array (FPGA).

22. The method as claimed in claim 20, wherein a host interface to connect the host and the memory controller, the host interface providing the data processing code information with the memory controller.

23. The method as claimed 20, wherein the stream processor further includes:
   a plurality of arithmetic logic units;
   a configuring memory device to store the data processing code information from the host; and
   a main controller to control the configuring memory, to alter the data processing code information, and to control data processing of the arithmetic logic units.

* * * * *